(12) United States Patent
Hamano et al.

(10) Patent No.: US 9,377,514 B2
(45) Date of Patent: Jun. 28, 2016

(54) SECONDARY-BATTERY MAXIMUM-CAPACITY MEASURING APPARATUS

(71) Applicant: YOKOGAWA ELECTRIC CORPORATION, Musashino-shi, Tokyo (JP)

(72) Inventors: Satoshi Hamano, Musashino (JP); Ryuuta Tanaka, Musashino (JP); Masaru Nakagomi, Musashino (JP); Satoshi Yoshitake, Musashino (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 410 days.

(21) Appl. No.: 14/100,019

(22) Filed: Dec. 9, 2013

(65) Prior Publication Data

US 2014/0167773 A1 Jun. 19, 2014

(30) Foreign Application Priority Data

Dec. 17, 2012 (JP) .................. 2012-274207

(51) Int. Cl.
*H02J 7/04* (2006.01)
*G01R 31/36* (2006.01)

(52) U.S. Cl.
CPC .......... *G01R 31/362* (2013.01); *G01R 31/3651* (2013.01)

(58) Field of Classification Search
CPC ..... G01R 31/3651; G01R 31/362; H02J 7/00; H02J 7/14; H01M 10/4257
USPC ................ 320/106, 110, 132, 133, 134, 157; 324/426, 427, 429, 430
See application file for complete search history.

(56) References Cited

U.S. PATENT DOCUMENTS

| | | | | | |
|---|---|---|---|---|---|
| 6,075,339 | A | * | 6/2000 | Reipur | H01M 10/4257 320/110 |
| 8,203,305 | B1 | * | 6/2012 | Wortham | G01R 31/3651 320/106 |

FOREIGN PATENT DOCUMENTS

JP 200971986 A 4/2009

* cited by examiner

*Primary Examiner* — Edward Tso
*Assistant Examiner* — Aaron Piggush
(74) *Attorney, Agent, or Firm* — Hauptman Ham, LLP

(57) ABSTRACT

A secondary-battery maximum-capacity measuring apparatus, includes: a current dependency processing unit configured to convert an inter-terminal voltage and an open cell voltage of a secondary battery into values without depending on a load current based on an amount of change in relative value of a voltage during a time period when a constant current is drawn from the secondary battery; and an error calculation unit configured to compute errors of the inter-terminal voltage and the open cell voltage of the secondary battery, the inter-terminal voltage and the open cell voltage being converted by the current dependency processing unit.

9 Claims, 16 Drawing Sheets

FIG. 3A

HISTORY OF CURRENT VALUE
AND VOLTAGE VALUE

| TIME | CURRENT | VOLTAGE |
|---|---|---|
| $t_1$ | $I_1$ | $V_1$ |
| $t_2$ | $I_2$ | $V_2$ |
| $t_3$ | $I_3$ | $V_3$ |
| ... | ... | ... |
| $t_{N-1}$ | $I_{N-1}$ | $V_{N-1}$ |
| $t_N$ | $I_N$ | $V_N$ |

NEWER

FIG. 3B

CURRENT WAVEFORM W1

| TIME | CURRENT |
|---|---|
| $t_1$ | $I_1$ |
| $t_2$ | $I_2$ |
| $t_3$ | $I_3$ |
| ... | ... |
| $t_{N-1}$ | $I_{N-1}$ |
| $t_N$ | $I_N$ |

NEWER

FIG. 3C

VOLTAGE WAVEFORM W3

| TIME | VOLTAGE |
|---|---|
| $t_1$ | $V_1$ |
| $t_2$ | $V_2$ |
| $t_3$ | $V_3$ |
| ... | ... |
| $t_{N-1}$ | $V_{N-1}$ |
| $t_N$ | $V_N$ |

NEWER

FIG. 5A

SOC WAVEFORM W4

| TIME | SOC |
|---|---|
| $t_1$ | $SOC_1$ |
| $t_2$ | $SOC_2$ |
| $t_3$ | $SOC_3$ |
| ... | ... |
| $t_{N-1}$ | $SOC_{N-1}$ |
| $t_N$ | $SOC_N$ |

↓ NEWER

FIG. 5B

OCV WAVEFORM W2

| TIME | OCV |
|---|---|
| $t_1$ | $OCV_1$ |
| $t_2$ | $OCV_2$ |
| $t_3$ | $OCV_3$ |
| ... | ... |
| $t_{N-1}$ | $OCV_{N-1}$ |
| $t_N$ | $OCV_N$ |

↓ NEWER

SECONDARY-BATTERY MAXIMUM-CAPACITY MEASURING APPARATUS

CROSS-REFERENCE TO RELATED APPLICATION

This application claims priority from Japanese Patent Application No. 2012-274207 filed with the Japan Patent Office on Dec. 17, 2012, the entire content of which is hereby incorporated by reference.

BACKGROUND

1. Technical Field

This disclosure relates to a secondary-battery maximum-capacity measuring apparatus. For details, this disclosure relates to an apparatus for measuring the maximum capacity of a secondary battery even during the use of the secondary battery.

2. Related Art

A secondary battery, which allows repetitive charge, is used as a power supply for driving a running motor for a hybrid vehicle, an electric vehicle, or similar vehicle. The secondary battery can store energy with a comparatively small environmental load, for example, energy generated by the sun or energy generated by wind power without relying on fossil fuel. Accordingly, there is a growing broad use of the secondary battery in, for example, industry, public institutions or standard homes.

Generally, these secondary batteries are each configured as a battery module for obtaining a desired output voltage by coupling the predetermined number of battery cells together in series. The secondary battery is configured as a battery pack for obtaining a desired current-carrying capacity (Ah) by coupling the predetermined number of the battery modules for obtaining the desired output voltage together in parallel.

For example, the secondary battery mounted on an automobile as a driving power supply for a running motor is considered to mainly employ a lithium-ion battery for the time being for the convenience of charging time, cruising distance, and similar matter.

Now, one of indexes representing the performance of the secondary battery is the maximum capacity of the battery. This maximum capacity can be defined as an electric quantity (Ah) output while an open cell voltage of the battery decreases from the maximum voltage to the available minimum voltage.

FIG. 16 is a block diagram illustrating one example of a conventional secondary-battery maximum-capacity measuring apparatus that measures the maximum capacity of a secondary battery in use. In FIG. 16, a current sensor 1 measures a current flowing through the secondary battery (hereinafter referred to as DUT) in use. A voltage sensor 2 measures an inter-terminal voltage of the secondary battery DUT in use.

A $\Delta Q$ calculation unit 3 integrates current values measured by the current sensor 1 so as to obtain an electric quantity $\Delta Q$ that has flowed through the DUT during a certain period of time.

An OCV calculation unit 4 uses voltage values measured by the voltage sensor 2 and current values measured by the current sensor 1 to obtain an open cell voltage OCV of the DUT during a certain period of time.

A $\Delta$SOC calculation unit 5 uses the open cell voltage OCV obtained by the OCV calculation unit 4 to obtain a change $\Delta$SOC in state of charge SOC during a certain period of time.

Here, the state of charge SOC can be obtained by using a known relationship between the state of charge SOC and the open cell voltage OCV.

A battery capacity measuring unit (maximum capacity measuring unit) 6 obtains the maximum capacity Q'max of the DUT with the following formula.

$$Q'\max[Ah] = \Delta Q[Ah] \times 100[\%]/\Delta SOC[\%]$$

A display unit 7 displays the maximum capacity Q'max measured by the battery capacity measuring unit 6 on, for example, a liquid crystal display.

JP-A-2009-71986 discloses a technique for determining a degree of deterioration of an on-vehicle battery without complicated computation.

SUMMARY

A secondary-battery maximum-capacity measuring apparatus includes: a current dependency processing unit configured to convert an inter-terminal voltage and an open cell voltage of a secondary battery into values without depending on a load current based on an amount of change in relative value of a voltage during a time period when a constant current is drawn from the secondary battery; and an error calculation unit configured to compute errors of the inter-terminal voltage and the open cell voltage of the secondary battery, the inter-terminal voltage and the open cell voltage being converted by the current dependency processing unit.

BRIEF DESCRIPTION OF DRAWINGS

FIG. 3A to FIG. 3C are explanatory diagrams of record data sequentially stored in a RAM of FIG. 1;

FIG. 5A and FIG. 5B are explanatory diagrams illustrating a concrete example of data columns in an OCV-waveform calculation unit of FIG. 4;

DETAILED DESCRIPTION

Figure 1:
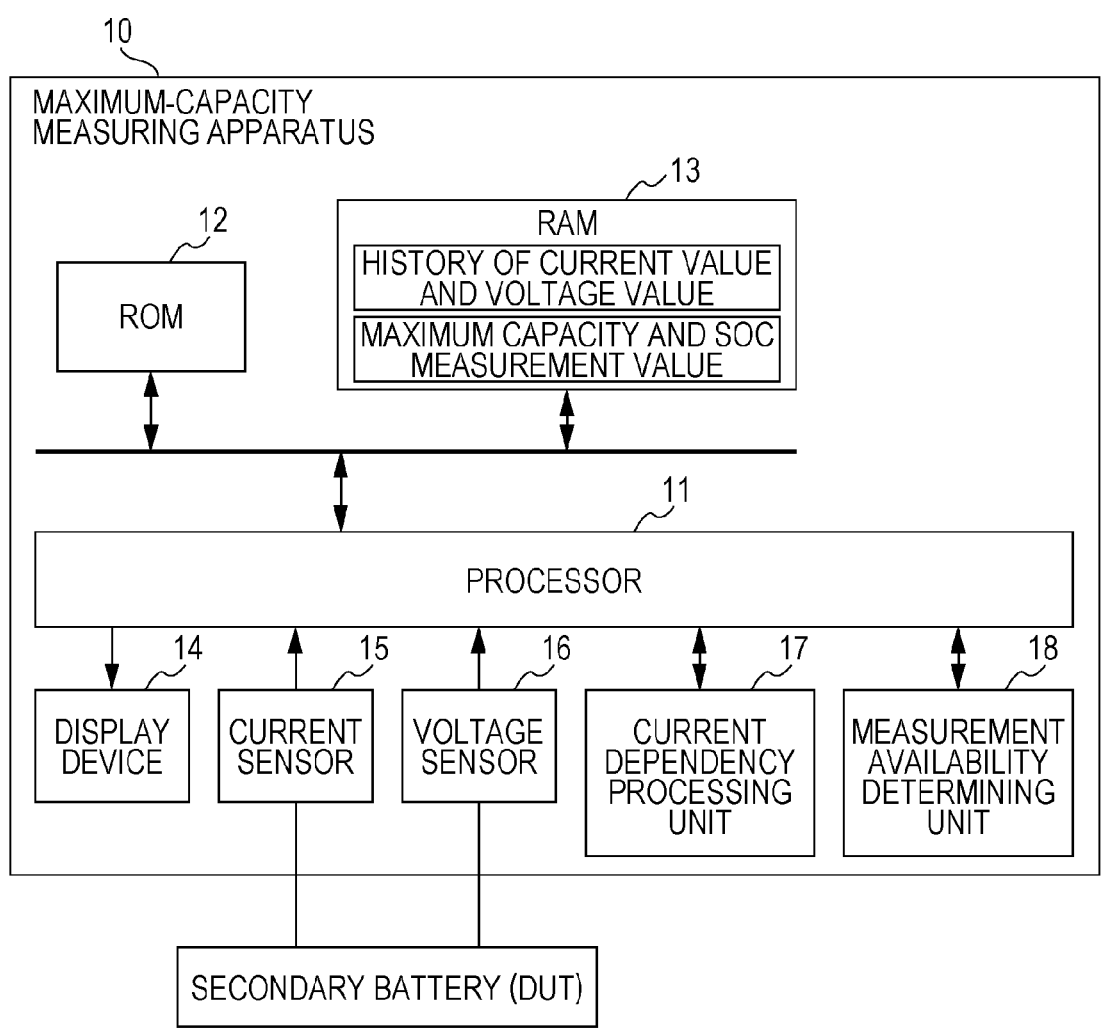
FIG. 1 is a block diagram illustrating a maximum-capacity measuring apparatus according to one embodiment of this disclosure.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Obtaining the open cell voltage of the DUT requires presence of time when an output current is 0 A during a certain period of time. The DUT that is an on-vehicle battery eventually goes off-line due to stopping of the vehicle. However, in the case where the DUT is a stationary battery used as, for example, a residential power supply. Since a load such as air conditioning may be always applied, the DUT does not necessarily have the output current of 0 A.

It is an object of this disclosure to provide a secondary-battery maximum-capacity measuring apparatus that allows measurement of the maximum capacity of a secondary battery even in an environment where the secondary battery is used without having the output current of 0 A.

In an embodiment of this disclosure, a secondary-battery maximum-capacity measuring apparatus (this apparatus) includes: a current dependency processing unit configured to convert an inter-terminal voltage and an open cell voltage of a secondary battery into values without depending on a load current based on an amount of change in relative value of a voltage during a time period when a constant current is drawn from the secondary battery; and an error calculation unit configured to compute errors of the inter-terminal voltage and the open cell voltage of the secondary battery, the inter-terminal voltage and the open cell voltage being converted by the current dependency processing unit.

In this apparatus, the current dependency processing unit may measure a difference between a voltage at a starting point and a voltage at an ending point during the time period when the constant current is drawn from the secondary battery, so as to calculate the amount of change in relative value of the voltage.

In this apparatus, the current dependency processing unit may differentiate a voltage during the time period when the constant current is drawn from the secondary battery, so as to calculate the amount of change in relative value of the voltage.

In this apparatus, the current dependency processing unit may retrieve and process measurement data of an environmental element including a temperature.

In this apparatus, a measurement availability determining unit may determine availability of maximum capacity measurement of the secondary battery based on distribution of state of charge in a predicted value waveform of a state of charge and distribution of feature points of state of charge versus open cell voltage characteristics.

This apparatus allows measurement of the maximum capacity of the secondary battery even in an environment of the secondary battery in use.

Hereinafter, an embodiment of this disclosure will be described in detail using the drawings. FIG. 1 is a block diagram illustrating a maximum-capacity measuring apparatus 10 according to this embodiment. In FIG. 1, a processor 11 controls the overall operation of the maximum-capacity measuring apparatus 10. The processor 11 couples to a ROM 12, a RAM 13, a display unit (display device) 14, a current sensor 15, a voltage sensor 16, a current dependency processing unit 17, a measurement availability determining unit 18, and similar unit.

The ROM 12 stores, for example, an execution program or characteristics data of the DUT in a non-volatile manner. The ROM 12 can be accessed from the processor 11. The non-volatile storage device can include, for example, a rewritable non-volatile memory such as a magnetic disk storage and a flash memory device.

The RAM 13 is a volatile data storage device. The RAM 13 can be accessed from the processor 11. The RAM 13 memorizes (stores) measurement data of the current value acquired by the current sensor 15, measurement data of the voltage value acquired by the voltage sensor 16, and similar data as history measurement data. Additionally, the RAM 13 stores, for example, a maximum capacity measurement value or a SOC measurement value that are measured by the current dependency processing unit 17 as a maximum capacity/SOC previous measurement value. The RAM 13 can include a high-speed random access memory. The RAM 13 can also include, for example, a rewritable non-volatile memory such as a magnetic disk storage and a flash memory device.

The display unit 14 functions as an output interface between the maximum-capacity measuring apparatus 10 and a user. The display unit 14 sends and receives electrical signals between the display unit 14 and the processor 11 to display, for example, a maximum capacity measurement value and a SOC measurement value of the DUT and a measurement availability determination result of these measurement values. The display unit 14 can employ, for example, a liquid crystal display or an organic LED.

The current sensor 15 has a function that detects current flowing through the DUT and converts the detected current into digital data. The processor 11 can read the current value of the current sensor 15.

The voltage sensor 16 has a function that detects an inter-terminal voltage of the DUT and converts the detected voltage into digital data. The processor 11 can read the voltage value of the voltage sensor 16.

The current dependency processing unit 17 obtains, for example, the maximum capacity measurement value and the SOC measurement value of the DUT based on the history measurement data of the current value and the voltage value stored in the RAM 13. Specifically, the current dependency processing unit 17 executes predetermined computation processing to obtain, for example, the maximum capacity measurement value and the SOC measurement value based on a processing start command output from the processor 11. When the computation processing for these values terminates, the current dependency processing unit 17 outputs a measurement termination signal. The computation result for these values is sequentially stored in the RAM 13 through the processor 11. The computation result stored in the RAM 13 is read out as necessary.

The measurement availability determining unit 18 determines availability for the maximum capacity measurement based on the history measurement data of the current value and the voltage value stored in the RAM 13. Specifically, the measurement availability determining unit 18 executes predetermined computation processing for determining the availability for the maximum capacity measurement based on the processing start command output from the processor 11. When this computation processing terminates, the measurement availability determining unit 18 outputs a determination termination signal. This determination result is sequentially memorized (stored) in the RAM 13 through the processor 11. The determination result stored in the RAM 13 is read out as necessary.

Figure 2:
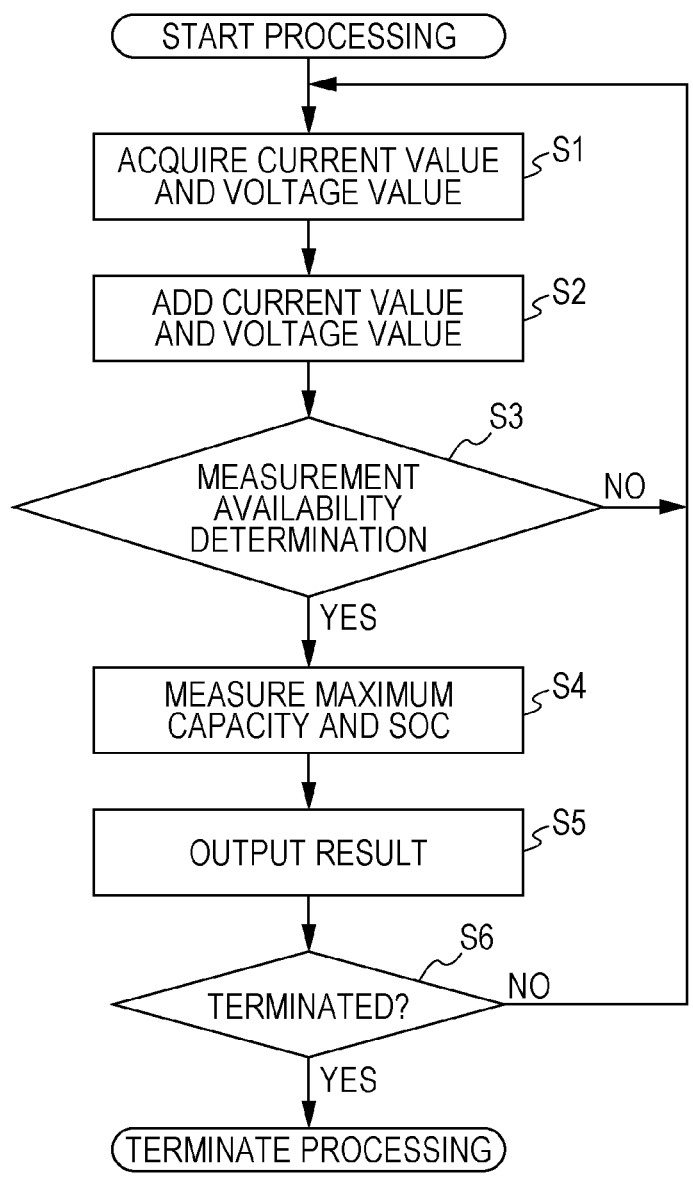
FIG. 2 is a flowchart describing a flow of operation of the maximum-capacity measuring apparatus illustrated in FIG. 1.

FIG. 2 is a flowchart describing a flow of operation of the maximum-capacity measuring apparatus 10. In FIG. 1, first, the processor 11 acquires the current value and the voltage value (in step S1). That is, the processor 11 acquires a current value Imon through the current sensor 15, and acquires a voltage value Vmon through the voltage sensor 16. Furthermore, the processor 11 also acquires, simultaneously with these measurement values, time data tmon through a clock function unit disposed inside or outside of the processor 11.

The processor 11 sequentially stores the acquired current value Imon and voltage value Vmon in the RAM 13 in the order corresponding to the history of the time data tmon (in step S2).

FIG. 3A to FIG. 3C are explanatory diagrams of record data of these values sequentially stored in the RAM 13. The record data includes data columns having measurement time data ti, a current value Ii, and a voltage value (a value of the inter-terminal voltage) Vi (i=1 to N). FIG. 3A illustrates the history of the current value and the voltage value. FIG. 3B illustrates the history of the current value. FIG. 3C illustrates the history of the voltage value. Here, the history of the current value Ii and the voltage value Vi is recorded as a ring buffer. When the data length exceeds the buffer length, the oldest data is deleted.

Again in FIG. 2, the RAM 13 sequentially stores various data such as the history data of the current value Ii and the voltage value Vi and the SOC measurement value representing the last measured maximum capacity or state of charge. The processor 11 determines whether the maximum capacity of the DUT can be measured through the measurement availability determining unit 18 based on these various data (in step S3). The processor 11 also sequentially stores the availability determination of this measurement in the RAM 13.

In the case where the measurement availability determining unit 18 determines that the measurement of the maximum capacity is possible, the processor 11 measures the maximum capacity and the state of charge SOC of the DUT through the current dependency processing unit 17 (in step S4). The processor 11 transfers the history data of the current value and the voltage value stored and memorized in the RAM 13 to the current dependency processing unit 17, and also outputs a measurement start command to the current dependency processing unit 17.

When measurement processing for the maximum capacity and the state of charge SOC of the DUT based on the measurement start command terminates, the current dependency processing unit 17 outputs the measurement termination signal to the processor 11. When the processor 11 has confirmed the measurement termination signal, the processor 11 acquires the maximum capacity measurement value and the SOC measurement value from the current dependency processing unit 17. Subsequently, the processor 11 sequentially stores the maximum capacity measurement value and the SOC measurement value in the RAM 13.

In the case where the measurement availability determining unit 18 determines that the measurement of the maximum capacity is impossible, the processor 11 returns to step S1 and continues acquisition of the current value and the voltage value.

The processor 11 controls the display unit 14 to display the maximum capacity value and the SOC value of the DUT stored in the RAM 13 and an availability determination result of the measurement (in step S5).

The processor 11 repeatedly executes this sequence of operations until the processor 11 determines processing termination (in step S6).

Figure 4:
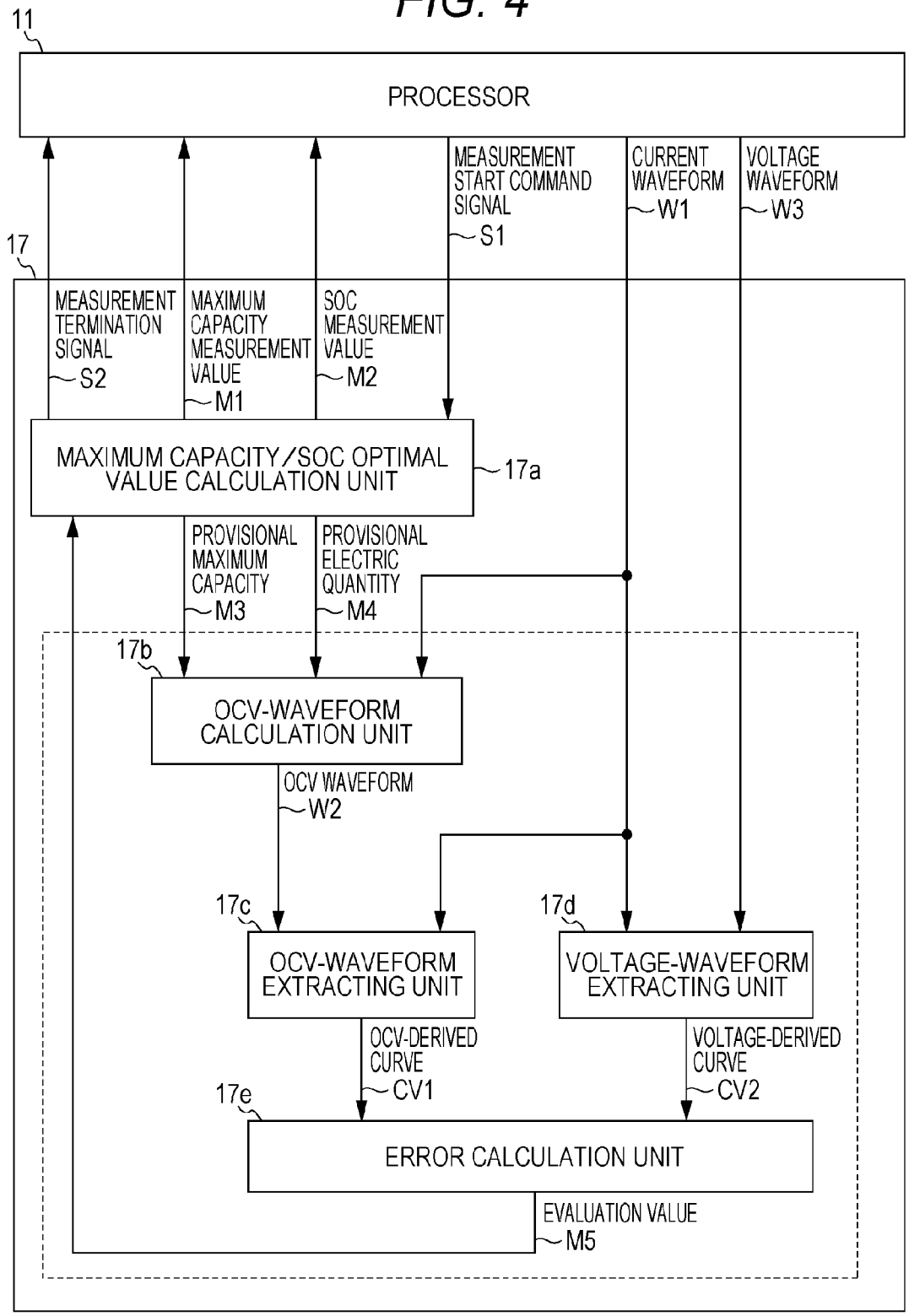
FIG. 4 is a block diagram illustrating a concrete example of a current dependency processing unit of FIG. 1.

FIG. 4 is a block diagram illustrating a concrete example of the current dependency processing unit 17. In FIG. 4, the current dependency processing unit 17 includes a maximum capacity/SOC optimal value calculation unit 17a, an OCV-waveform calculation unit (open cell voltage-waveform calculation unit) 17b, an OCV-waveform extracting unit (open cell voltage-waveform extracting unit) 17c, a voltage-waveform extracting unit (inter-terminal voltage-waveform extracting unit) 17d, and an error calculation unit 17e.

The maximum capacity/SOC optimal value calculation unit (optimal value calculation unit) 17a starts measurement operation based on a measurement start command signal S1 output from the processor 11. The maximum capacity/SOC optimal value calculation unit 17a determines a maximum capacity measurement value M1 and a SOC measurement value M2. The maximum capacity measurement value M1 represents a measurement value of the present maximum capacity of the DUT coupled to the apparatus. The SOC measurement value M2 represents a measurement value of the SOC at the latest time tN in history X of the current value and the voltage value stored at present.

For the determination of the maximum capacity measurement value M1 and the SOC measurement value M2, the maximum capacity/SOC optimal value calculation unit 17a repeats the following procedure. This procedure is repeated until a pair of a provisional maximum capacity M3 and a provisional electric quantity M4 is obtained in a state where an evaluation value output from the error calculation unit 17e becomes minimum.

1) The maximum capacity/SOC optimal value calculation unit 17a determines the provisional maximum capacity M3 and the provisional electric quantity M4.

2) The maximum capacity/SOC optimal value calculation unit 17a outputs the pair of the provisional maximum capacity M3 and the provisional electric quantity M4 to the OCV-waveform calculation unit 17b.

3) The OCV-waveform calculation unit 17b computes an OCV waveform W2 based on the pair of the provisional maximum capacity M3 and the provisional electric quantity M4 and an input current waveform W1 of the secondary battery input from the processor 11. Subsequently, the OCV-waveform calculation unit 17b outputs the computation result of the OCV waveform W2 to the OCV-waveform extracting unit 17c.

4) The OCV-waveform extracting unit 17c extracts (creates) an OCV-derived curve (open cell voltage-derived curve) CV1 based on the OCV waveform W2 input from the OCV-waveform calculation unit 17b and the current waveform W1 of the secondary battery input from the processor 11. Subsequently, the OCV-waveform extracting unit 17c outputs the extracted OCV-derived curve CV1 to the error calculation unit 17e.

5) The voltage-waveform extracting unit (the inter-terminal voltage-waveform extracting unit) 17d extracts (creates) a voltage-derived curve (inter-terminal voltage-derived curve) CV2 based on the current waveform W1 of the secondary battery and a waveform W3 of the inter-terminal voltage input from the processor 11. The voltage-waveform extracting unit 17d outputs the extracted voltage-derived curve CV2 to the error calculation unit 17e.

6) The error calculation unit 17e computes an evaluation value M5 for errors based on the OCV-derived curve CV1 input from the OCV-waveform extracting unit 17c and the voltage-derived curve CV2 input from the voltage-waveform extracting unit 17d. The error calculation unit 17e inputs a computation result of the evaluation value M5 to the maximum capacity/SOC optimal value calculation unit 17a.

7) The maximum capacity/SOC optimal value calculation unit 17a outputs the pair of the provisional maximum capacity M3 and the provisional electric quantity M4 in a state where the evaluation value M5 becomes minimum to the processor 11 as the maximum capacity measurement value M1 and the SOC measurement value M2. That is, the maximum capacity/SOC optimal value calculation unit 17a outputs the provisional maximum capacity M3 among the pair of the provisional maximum capacity M3 and the provisional electric quantity M4 in a state where the evaluation value M5 becomes minimum to the processor 11 as the maximum capacity measurement value M1. Here, the SOC measurement value M2 is a value obtained by dividing the provisional electric quantity M4 by the provisional maximum capacity M3. This function is typical curve fitting using the maximum capacity and the electric quantity as coefficients, and can employ various algorithms.

For example, in the case where the secondary battery is coupled as the DUT in a state where the maximum capacity was 2500 mAh at the start of operation and then has decreased to 2000 mAh due to deterioration, the maximum capacity/SOC optimal value calculation unit 17a can obtain the maximum capacity measurement value M1 and the SOC measurement value M2 with the following procedure.

a) The provisional maximum capacity M3 is changed from 2000 mAh to 2500 mAh by step of 5 mAh. The provisional electric quantity M4 is changed from 0 mAh to 2500 mAh by step of 25 mAh.

b) The evaluation value M5 is computed for each pair, and the computation result is memorized with the pair.

c) When calculation on all the pairs is terminated, a pair with the smallest evaluation value M5 is searched. The provisional maximum capacity M3 and the provisional electric quantity M4 in the pair with the smallest evaluation value M5 are respectively assumed to be the maximum capacity measurement value M1 and the SOC measurement value M2.

The OCV-waveform calculation unit 17b obtains the OCV waveform W2 as an open cell voltage that temporally changes. The OCV waveform W2 includes, as illustrated in FIG. 5B, a time ti and an OCVi (i=1 to N) that is an open cell voltage OCV of the DUT at the time ti.

The OCV-waveform calculation unit 17b preliminarily obtains the open cell voltage OCV of the DUT with respect to the state of charge SOC from 0 to 100%. The OCV-waveform calculation unit 17b obtains OCV characteristics by referring to a SOCi that is the state of charge SOC at the time ti. The SOC waveform W4 includes, as illustrated in FIG. 5A, the time ti and the SOCi (i=1 to N) that is the state of charge SOC of the DUT at that time.

The SOC waveform W4 can be obtained by, as illustrated in the following formula, using the current waveform W1, the provisional maximum capacity M3, and the provisional electric quantity M4 to integrate the current value.

$$SOCi = (\text{provisional electric quantity } M4 + \Sigma((Ij-1) \times (tj-(tj-11))))/\text{provisional maximum capacity } M3$$

The OCV-waveform extracting unit 17c extracts the OCV data from the OCV waveform W2 corresponding to the current waveform W1. The OCV-waveform extracting unit 17c outputs the extracted OCV data to the error calculation unit 17e as the OCV-derived curve CV1.

The OCV-waveform extracting unit 17c creates the OCV-derived curve CV1 using a column of a value Yk (k=1 to M).

The OCV-waveform extracting unit 17c extracts the OCVi when the gradient of the voltage Vi with respect to the time is determined to substantially coincide with the gradient of the open cell voltage OCV at the same time ti with respect to the time. The determination of these gradients is made corresponding to the current waveform W1.

The OCV-waveform extracting unit 17c extracts the time ti and the OCVi that is the open cell voltage OCV of the DUT at the time ti from the OCV waveform W2 in accordance with the time change where i=1 to N. When it is determined that the current has changed by a certain amount or more, the OCV-waveform extracting unit 17c then stops the extraction in the transient response time. The transient response time is determined in proportion to a changed current ΔI. The transient response times exist corresponding to the number of determinations where the current has changed.

The OCV-waveform extracting unit 17c subtracts the open cell voltage OCV at the starting point for each time period when the open cell voltage OCV is continuously extracted, from the open cell voltage OCV in the overall time period so as to determine (generate) a relative voltage (first relative voltage) Yk.

$$Yk = OCVi - OCV0 \;(*\text{when } tk=ti)$$

OCV0: the open cell voltage OCV at the starting point for each time period when the open cell voltage OCV is continuously extracted.

The voltage-waveform extracting unit 17d extracts voltage data from the voltage waveform W3 corresponding to the current waveform W1. The voltage-waveform extracting unit 17d outputs the extracted voltage data to the error calculation unit 17e as the voltage-derived curve CV2.

The voltage-waveform extracting unit 17d uses a value Zk (k=1 to M) to create the voltage-derived curve.

The voltage-waveform extracting unit 17d extracts the voltage Vi when the gradient of the voltage Vi with respect to the time is determined to substantially coincide with the gradient of the open cell voltage OCV at the same time ti with respect to the time. The determination of these gradients is made corresponding to the current waveform W1.

The voltage-waveform extracting unit 17d extracts the time ti and the voltage Vi at that time from the voltage waveform W3 in accordance with the time change where i=1 to N. When it is determined that the current has changed by a certain amount or more, the voltage-waveform extracting unit 17d then stops the extraction during the transient response time. The transient response time is determined in proportion to the changed current ΔI. The transient response time exists corresponding to the number of determinations where the current has changed.

The voltage-waveform extracting unit 17d subtracts the inter-terminal voltage at the starting point for each time period when the inter-terminal voltage is continuously extracted, from the inter-terminal voltage in the overall time period so as to determine (generate) the relative voltage (second relative voltage) Zk.

$$Zk = Vi - V0 \;(*\text{when } tk=ti)$$

V0: the voltage at the starting point for each time period when the voltage is continuously extracted.

The error calculation unit 17e obtains the degree of coincidence between the OCV-derived curve CV1 and the voltage-derived curve CV2 as the evaluation value M5. The degree of coincidence between the OCV-derived curve CV1 and the voltage-derived curve CV2 increases as the evaluation value M5 decreases. As a simple example for obtaining this evaluation value M5, the squares of the difference between the relative voltages Yk and Zk (or ΔZk) are obtained from k=1 to M and the summation of all the squares is obtained.

8) The maximum capacity/SOC optimal value calculation unit 17a outputs a measurement termination signal S2 to the processor 11 when the sequence of the measurement processing is completed.

Figure 6:
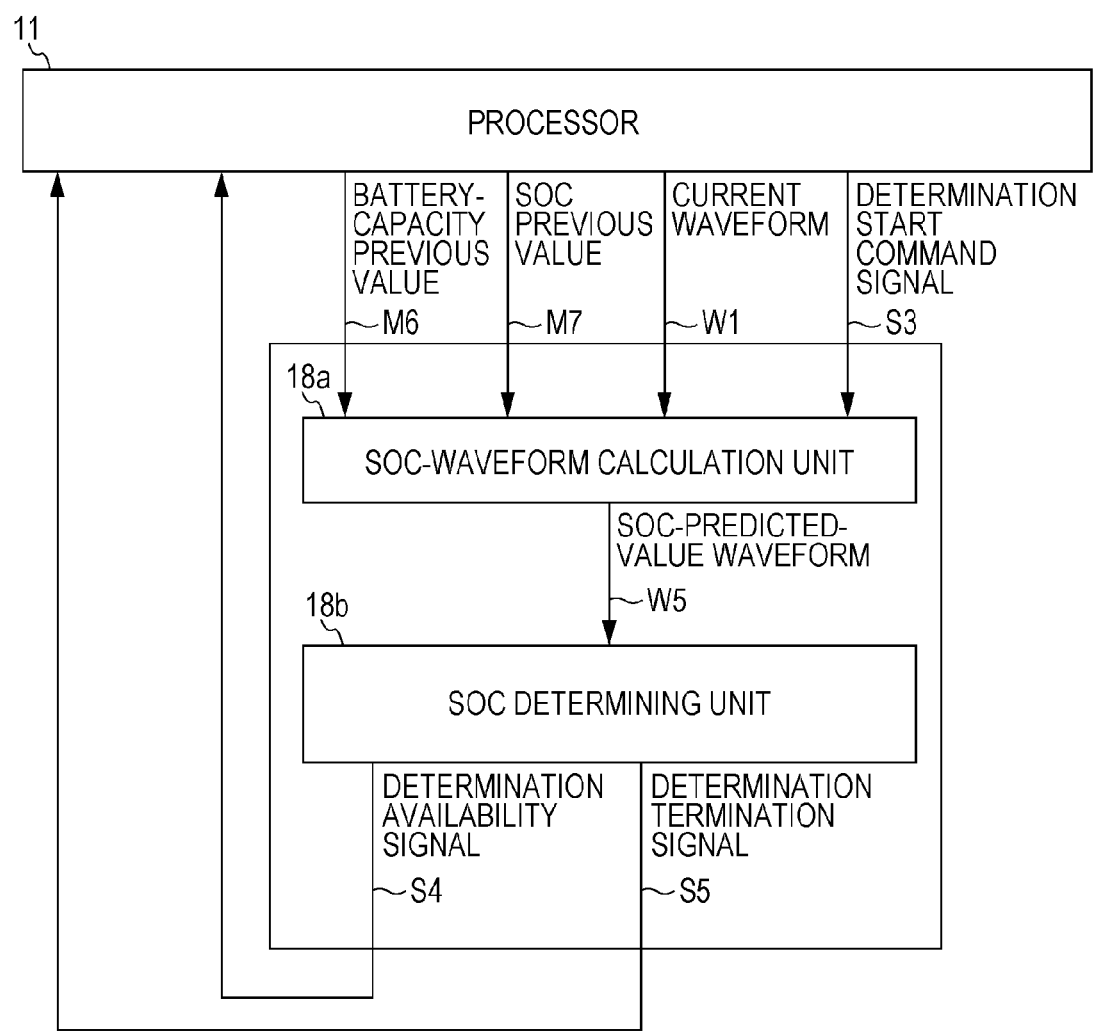
FIG. 6 is a block diagram illustrating a concrete example of a measurement availability determining unit of FIG. 1.

FIG. 6 is a block diagram illustrating a concrete example of the measurement availability determining unit 18. In FIG. 6, the measurement availability determining unit 18 includes a SOC-waveform calculation unit 18a and a SOC determining unit 18b.

The SOC-waveform calculation unit 18a starts the operation in accordance with a determination start command signal S3 output from the processor 11. On the premise that both the maximum capacity and the state of charge SOC have a little change from the previous measurement, the SOC-waveform calculation unit 18a predicts the state of charge SOC at the ti (i=1 to N). The SOC-waveform calculation unit 18a outputs a prediction result as a SOC-predicted-value waveform W5.

The SOC-predicted-value waveform W5 includes a time ti and a predicted value SOC'i (i=1 to N) of the state of charge SOC of the DUT at the time ti. The SOC-waveform calculation unit 18a receives the last measured maximum capacity that is record and stored in the RAM 13 as a battery-capacity previous value M6. The SOC-waveform calculation unit 18a receives the last measured state of charge SOC that is recorded and stored in the RAM 13 as a SOC previous value M7. Furthermore, the SOC-waveform calculation unit 18a also receives the current waveform W1 that is recorded and stored in the RAM 13.

The predicted value SOC'i is calculated as the following formula.

SOC'$i$=SOC previous value $M7-(\Sigma((Ij-1)\times(tj-(tj-1)))$ ($j$=1 to $N$))/battery-capacity previous value $M6+$ $(\Sigma((Ij-1)\times(tj-(tj-1)))(j=1$ to $i$))/battery-capacity previous value $M6$.

The SOC determining unit 18b compares distribution of state of charge SOC in the SOC-predicted-value waveform W5 with distribution of feature point of SOC-OCV characteristics so as to invert the availability of the maximum capacity measurement. For example, in the case where the feature point is included in a range of the SOC from 20% to 60% and the predicted value SOC'i does not include a value from 20 to 60%, the SOC determining unit 18b determines the measurement of the maximum capacity is impossible.

When the determination processing terminates, the SOC determining unit 18b outputs the determination result to the processor 11 as a determination availability signal S4 and further outputs a determination termination signal S5 to the processor 11.

Figure 7:
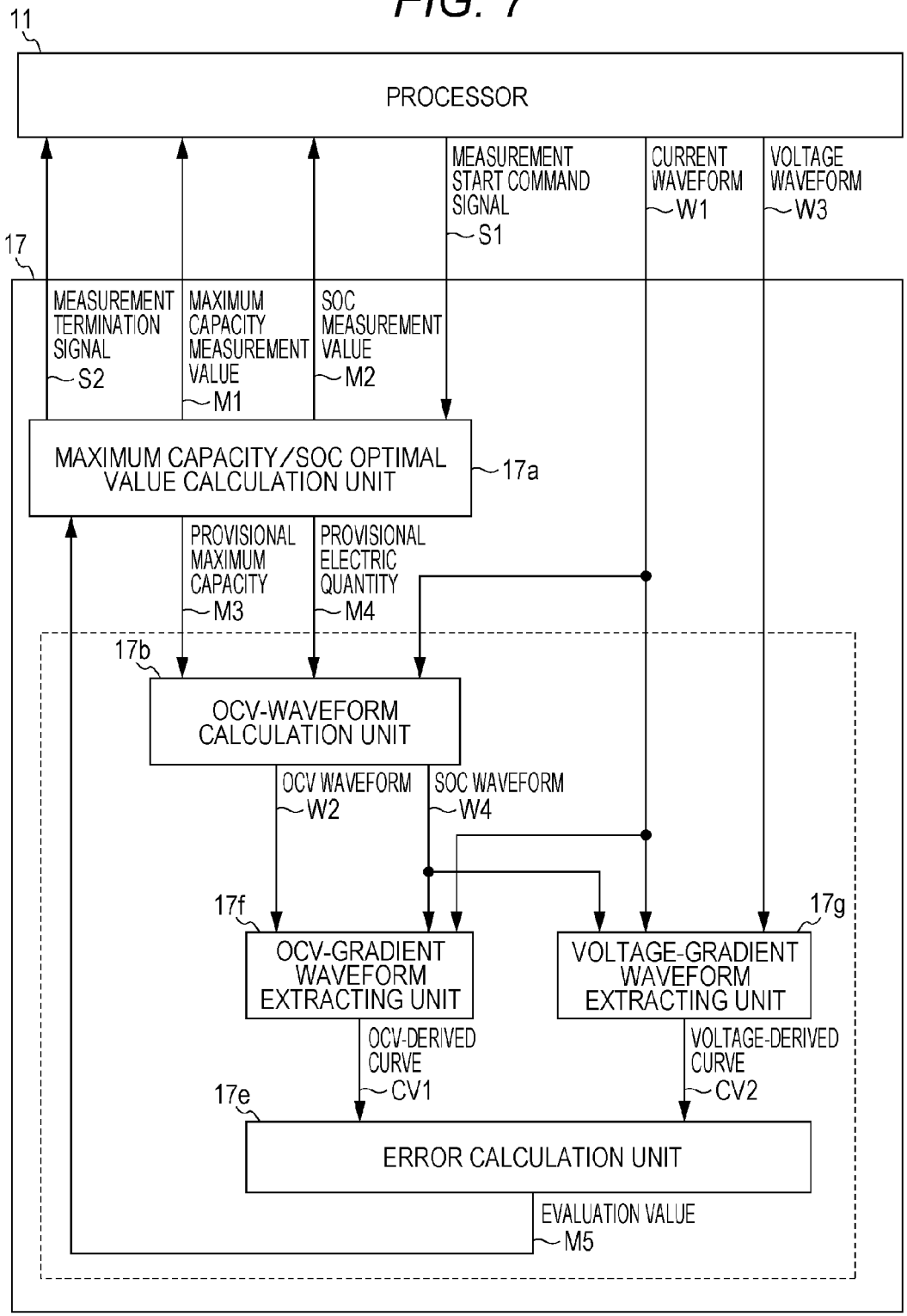
FIG. 7 is a block diagram illustrating another concrete example of the current dependency processing unit of FIG. 1.

FIG. 7 is a block diagram illustrating another concrete example of the current dependency processing unit 17. In FIG. 7, the same reference numerals are given to the common parts in FIG. 4. In FIG. 7, the current dependency processing unit 17 includes the maximum capacity/SOC optimal value calculation unit 17a, the OCV-waveform calculation unit 17b, an OCV-gradient waveform extracting unit 17f, a voltage-gradient waveform extracting unit 17g, and the error calculation unit 17e.

The OCV-gradient waveform extracting unit (the open cell voltage-waveform extracting unit) 17f extracts OCV data from the OCV waveform W2 corresponding to the current waveform W1. The OCV-gradient waveform extracting unit 17f outputs the extracted OCV data to the error calculation unit 17e as the OCV-derived curve CV1. The OCV-derived curve CV1 includes a column of a voltage value Yk (k=1 to M). When the gradient of the voltage Vi with respect to the time is determined to substantially coincide with the gradient of the open cell voltage OCV at the same time ti with respect to the time, the OCV-gradient waveform extracting unit 17f extracts the OCVi that is the open cell voltage OCV at the time ti. Subsequently, the OCV-gradient waveform extracting unit 17f adds the extracted OCVi to the OCV-derived curve CV1.

The above-described determination is made corresponding to the current waveform W1. The OCV-gradient waveform extracting unit 17f extracts the time ti and the OCVi, which is the open cell voltage OCV at the time ti, from the OCV waveform W2 in accordance with the time change where i=1 to N. When it is determined that the current has changed by a certain amount or more, the OCV-gradient waveform extracting unit 17f then stops the extraction in the transient response time.

The transient response time is determined in proportion to the changed current ΔI. The transient response time exists corresponding to the number of determinations where the current has changed.

Assuming that a value obtained by differentiating the OCVi with respect to time is Yk, the Yk can be expressed by the following formula. This Yk corresponds to the relative voltage.

$Yk=(OCVi-(OCVi-1))/(ti-(ti-1))$ (*when $tk=ti$)

The voltage-gradient waveform extracting unit (the inter-terminal voltage-waveform extracting unit) 17g extracts voltage data from the voltage waveform W3 corresponding to the current waveform W1. The voltage-gradient waveform extracting unit 17g outputs the extracted voltage data to the error calculation unit 17e as the voltage-derived curve CV2. The voltage-derived curve CV2 includes a column of the value Zk (k=1 to M). When the gradient of the voltage Vi with respect to the time is determined to substantially coincide with the gradient of the open cell voltage OCV at the same time ti with respect to the time, the voltage-gradient waveform extracting unit 17g extracts Vi that is the voltage V at the time ti. Subsequently, the voltage-gradient waveform extracting unit 17g adds the extracted Vi to the voltage-derived curve CV2.

The above-described determination is made corresponding to the current waveform W1. The voltage-gradient waveform extracting unit 17g extracts the time ti and the voltage Vi at the time ti from the voltage waveform W3 in accordance with the time change where i=1 to N. When it is determined that the current has changed by a certain amount or more, the voltage-gradient waveform extracting unit 17g then stops the extraction in the transient response time.

The transient response time is determined in proportion to the changed current ΔI. The transient response time exists corresponding to the number of determinations where the current has changed.

Here, assuming that a value obtained by differentiating the voltage Vi with respect to time is Zk, the Zk can be expressed by the following formula. This Zk also corresponds to the relative voltage.

$Zk=(Vi-(Vi-1))/(ti-(ti-1))$ (*when $tk=ti$)

These configurations can provide the following effects.
(A. Load Dependency of Internal Resistance)
Generally, in the case where a substantially constant current I regardless of time change flows through the secondary battery, the inter-terminal voltage V undergoes a transient phenomenon in association with time passage. Afterward, the inter-terminal voltage V approaches V=OCV−I×R. Here, OCV represents the open cell voltage and R represents the internal resistance of the secondary battery.

When the internal resistance R is substantially constant regardless of current, the internal resistance R is obtained based on the relationship between the current I and the inter-terminal voltage V, and I×R is added to the inter-terminal voltage V so as to obtain the open cell voltage OCV.

Furthermore, when the relationship between the state of charge SOC and the open cell voltage OCV of the battery is already known, the state of charge SOC can be obtained from the open cell voltage OCV. Obtaining the state of charge SOC allows measurement of the maximum capacity as described above.

However, in practice, it is known that the internal resistance R is not constant and depends on the current I. That is, the inter-terminal voltage V is expressed by V=OCV−I×R(I). Thus, it is difficult to use the above-described method. This is because the current dependency of the internal resistance R makes it difficult to obtain the open cell voltage OCV from the inter-terminal voltage V.

On the other hand, the method based on this embodiment described above uses the characteristics of the open cell voltage OCV changing depending on the state of charge SOC allows specifying the values of the open cell voltage OCV and the maximum capacity substantially without the influence of the load dependency of the internal resistance R.

Here, not only the absolute value of the open cell voltage OCV changes depending on the state of charge SOC. The amount of change in open cell voltage OCV changed from one state of charge SOC to another state of charge SOC, alternatively, the gradient of the open cell voltage OCV with respect to the state of charge SOC is also the characteristics of the open cell voltage OCV changing depending on the state of charge SOC. Furthermore, the gradient of the open cell voltage OCV with respect to the state of charge SOC typically changes with the state of charge SOC.

This embodiment uses these characteristics of the secondary battery. This embodiment does not use the absolute value of the open cell voltage OCV, but uses the amount of change in open cell voltage OCV changed from one state of charge SOC to another state of charge SOC, alternatively, the gradient of the open cell voltage OCV with respect to the state of charge SOC. Accordingly, this embodiment accurately specifies the maximum capacity without the influence of the current dependency of the internal resistance R.

Figure 8:
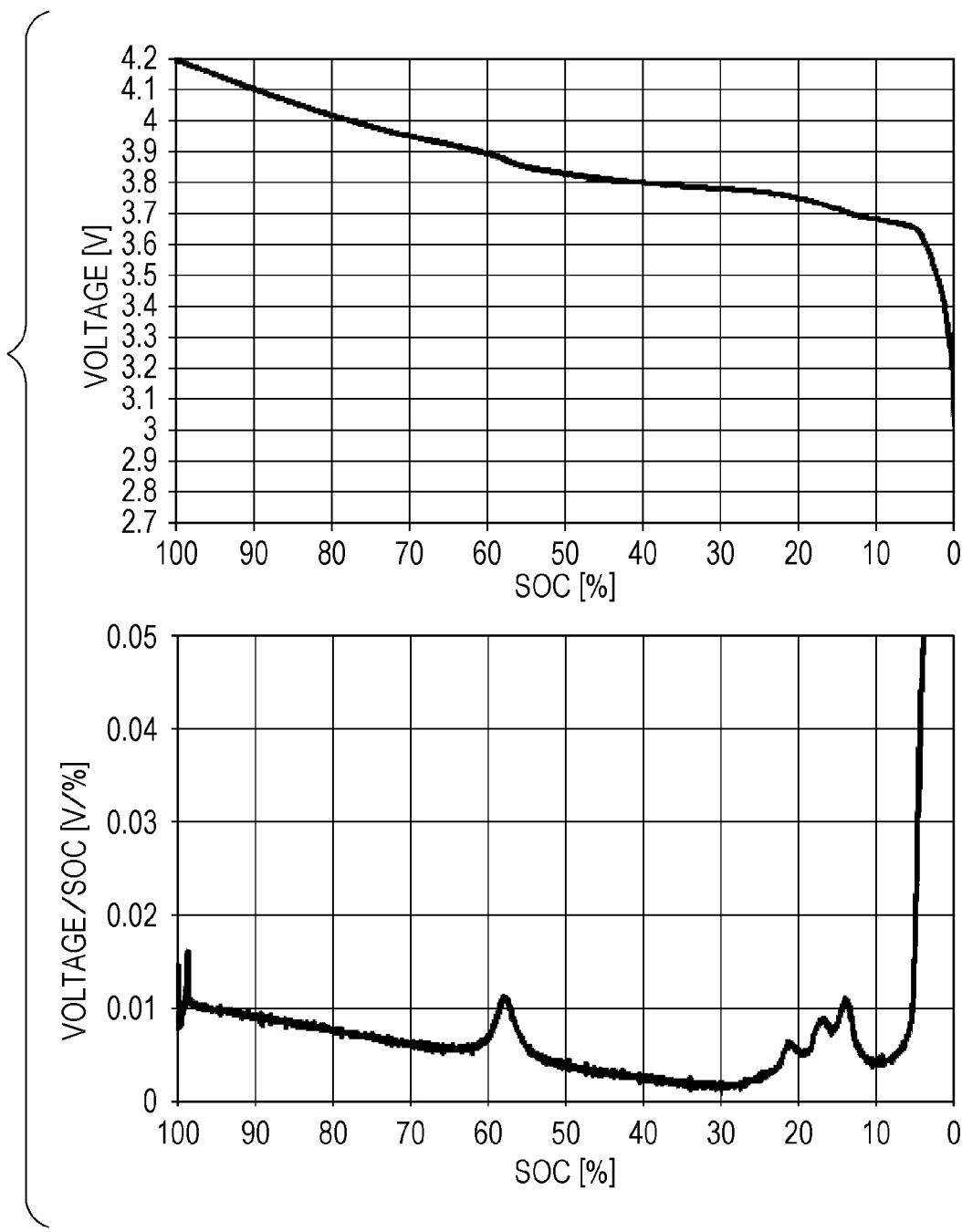
FIG. 8 is an exemplary characteristic diagram where an open cell voltage OCV and a gradient of the open cell voltage OCV with respect to a state of charge SOC in a commercially available secondary battery are measured over a range of the state of charge SOC from 0% to 100%.

FIG. 8 illustrates one example of a result of measuring the open cell voltage OCV and the gradient of the open cell voltage OCV with respect to the state of charge SOC in a commercially available secondary battery (DUT) over a range of the state of charge SOC from 0% to 100%. In case of this DUT, the gradient of the open cell voltage OCV changes all over the state of charge SOC. Especially, the change in gradient has characteristics seen in the proximity of the state of charge SOC from 10% to 20% and in the proximity of the state of charge SOC from 50% to 60%.

(B. Cancellation of Current Load Dependency of Internal Resistance)

Figure 9:
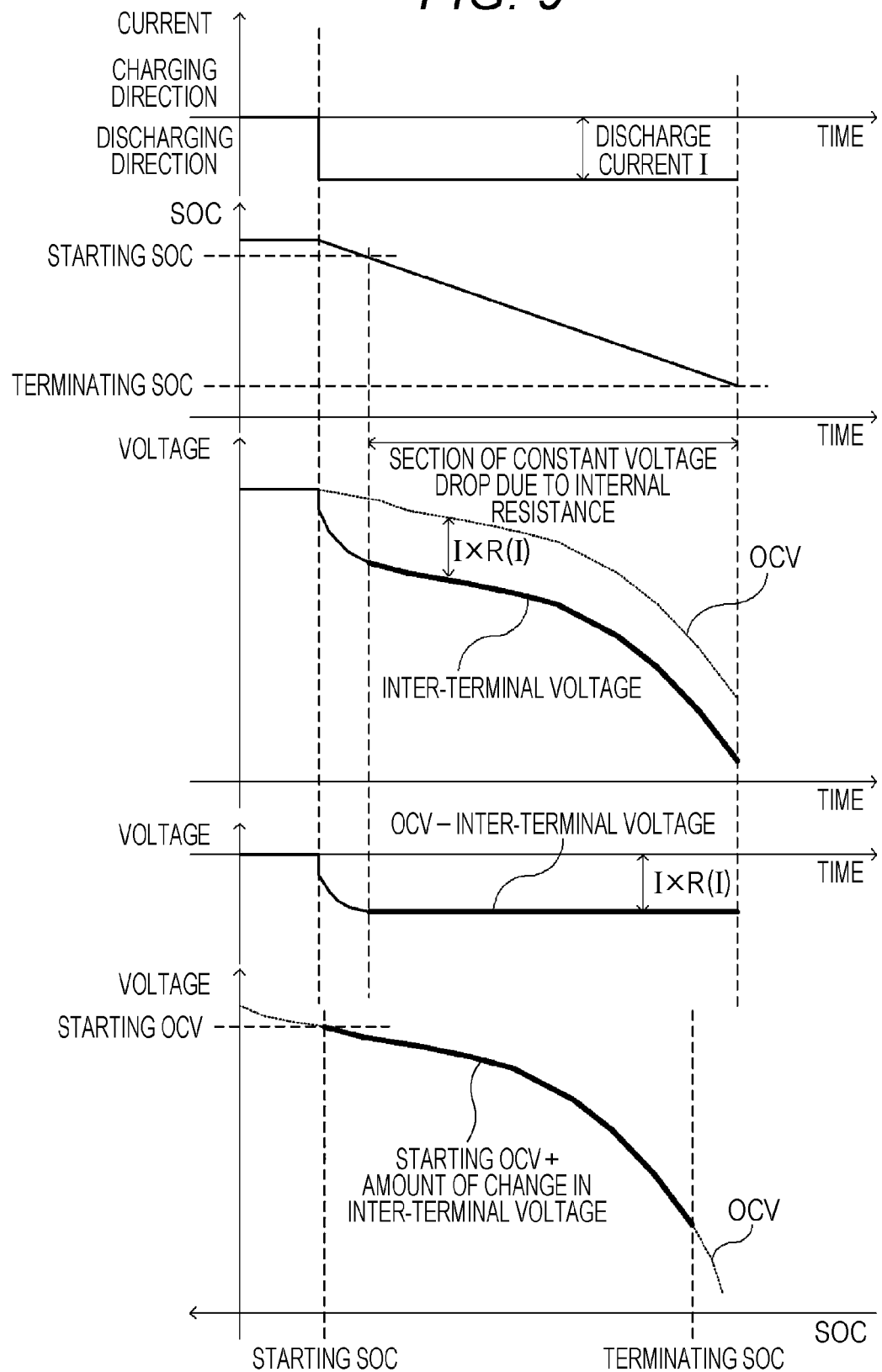
FIG. 9 is a characteristics diagram illustrating one example of a relationship between an inter-terminal voltage V and an open cell voltage OCV in the secondary battery.

FIG. 9 is a characteristics diagram illustrating one example of the relationship between the inter-terminal voltage V and the open cell voltage OCV in the secondary battery. When the time for the substantially constant current I regardless of time change to flow from the secondary battery is sufficiently long, a state of charge SOC(t) of the battery changes. An open cell voltage OCV(t) also changes in association with the change of the state of charge SOC(t).

At this time, a voltage V(t) that the inter-terminal voltage V approaches can be expressed by the following formula.

$$V(t)=OCV(t)-I\times R(I)$$

Here, the current I, the internal resistance R(I), and I×R(I) on the right side are also substantially constant and can be considered as constants. That is, the voltage V(t) is a value obtained by offsetting the open cell voltage OCV(t) by I×R(I).

This can also be seen in a result of the following formula for differentiating the voltage V(t).

$$dV(t)/dt = dOCV'(t)/dt - d(I \times R(I))/dt = dOCV'(t)/dt$$

That is, it is difficult to obtain the absolute value of the open cell voltage OCV(t) from the voltage V(t). However, the value obtained by offsetting the open cell voltage OCV(t) and the value obtained by differentiating the open cell voltage OCV(t) with respect to time can be obtained from the voltage V(t).

These values include the characteristics of the open cell voltage OCV changing depending on the state of charge SOC. This is because the state of charge SOC(t) also changes with time.

If the current I is not substantially constant and associated with a slight time change or the internal resistance R has time dependency, errors are acceptable to the extent that the following formula is satisfied.

$$dOCV(t)/dt << d(I \times R(I))/dt$$

That is, this embodiment can obtain the value of the offset open cell voltage OCV(t) and the value obtained by differentiating the open cell voltage OCV(t) with respect to time from the voltage V(t), thus obtaining the characteristics of the open cell voltage OCV without depending on the load.

(C. Actual Operation Waveform)

Figure 10:
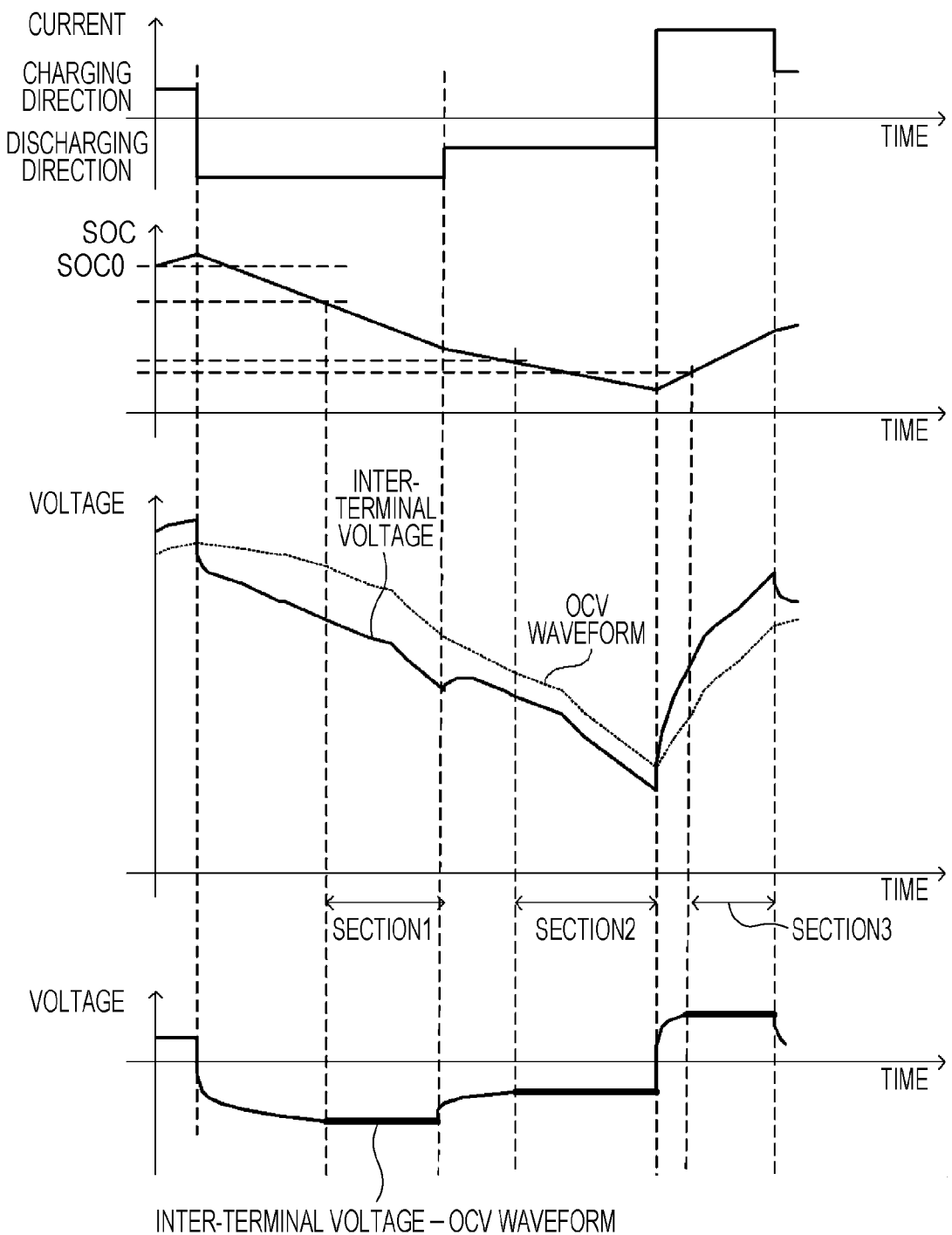
FIG. 10 is an exemplary characteristic diagram illustrating a voltage change during the use of the secondary battery.

FIG. 10 is an exemplary characteristic diagram illustrating a voltage change during the use of the secondary battery. During the use of the secondary battery, a time period when the current flowing through the secondary battery is substantially constant occurs repeatedly. Alternatively, a time period when the current change is so small that the current flowing through the secondary battery is assumed to be substantially constant regardless of time change occurs. In each time period when the current is substantially constant, the above-described relationship between the voltage V(t) and the open cell voltage OCV(t) is held.

Therefore, as described above, this embodiment sequentially records and stores the open cell voltage OCV(t) as a waveform changing with time while monitoring the inter-terminal voltage V(t) of the battery in use. This allows using the open cell voltage OCV(t) for measurement of the state of charge SOC(t).

(D. Curve Fitting)

Figure 11:
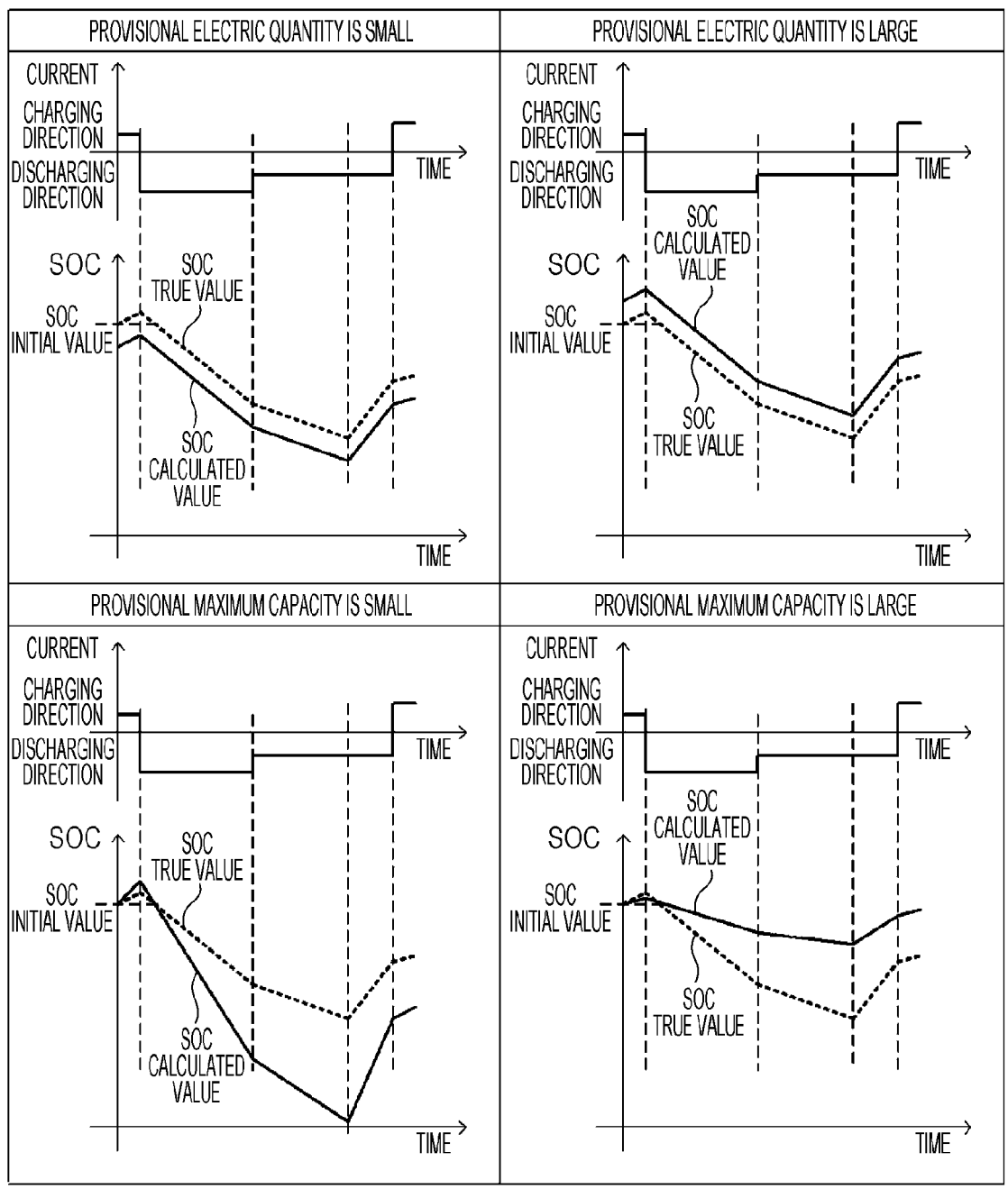
FIG. 11 is an exemplary characteristic diagram illustrating a relationship between parameters of the secondary battery and the state of charge SOC.
Figure 12:
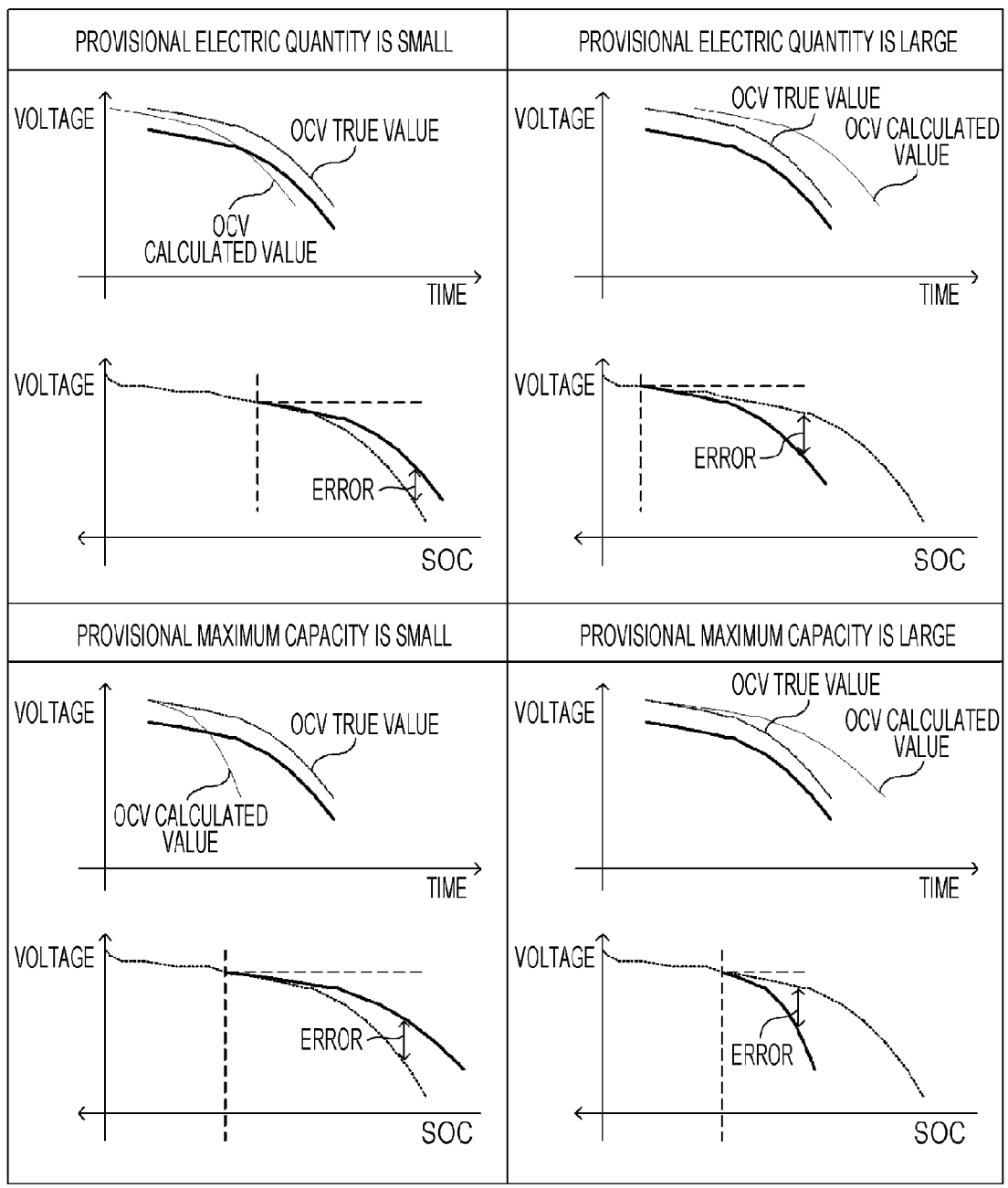
FIG. 12 is an exemplary characteristic diagram illustrating a relationship between parameters of the secondary battery and the open cell voltage OCV.

FIG. 11 is an exemplary characteristic diagram illustrating a relationship between parameters of the secondary battery and the state of charge SOC. FIG. 12 is an exemplary characteristic diagram illustrating a relationship between parameters of the secondary battery and the open cell voltage OCV. The voltage V(t) and the open cell voltage OCV(t) in the secondary battery are both vectors. Accordingly, it is difficult to directly obtain the state of charge SOC from the voltage V(t) and the open cell voltage OCV(t).

Therefore, this embodiment employs a method for searching the state of charge SOC using the method of curve fitting. The state of charge SOC(t) is determined by the following two parameters.

a) Maximum Capacity b) Electric Quantity when t=0 (dischargeable maximum electric quantity)

In this embodiment, as described above, provisionally determining these two parameters allows calculation of the state of charge SOC(t). The deviation of the parameters from a true value is reflected as the deviation of the state of charge SOC(t). Furthermore, the deviation of the state of charge SOC(t) is reflected as the deviation of the open cell voltage OCV(t).

At this time, regarding the voltage V(t) and the open cell voltage OCV(t), the load dependency of the resistance is removed and then the sum of squares of the errors is obtained. This converts the deviation between the true value and the calculated value of the open cell voltage OCV(t) into a scalar value. This is an evaluation value for a feedback where the parameters decrease as the parameters become close to the true value and for driving an algorithm of the curve fitting.

Generally, the internal resistance R of the secondary battery does not depend only on current, but also on temperature of the battery. Even if the current does not change with time and is substantially constant, change in temperature makes the internal resistance R to change. Accordingly, the relationship of dV(t)/dt=dOCV(t)/dt is not satisfied.

In this case, the problem can be solved by modifying the maximum-capacity measuring apparatus 10 in FIG. 1 such that the relative voltage Zk is not obtained within a time where the current is substantially constant, but the current and the temperature are obtained together with the Zk within a substantially constant time.

Here, this method is also applicable to an environmental element other than the temperature. In the case where the internal resistance R of the secondary battery is affected by the environmental element other than the temperature, it is only necessary to replace a temperature sensor by a sensor for measuring this environmental element.

Figure 13:
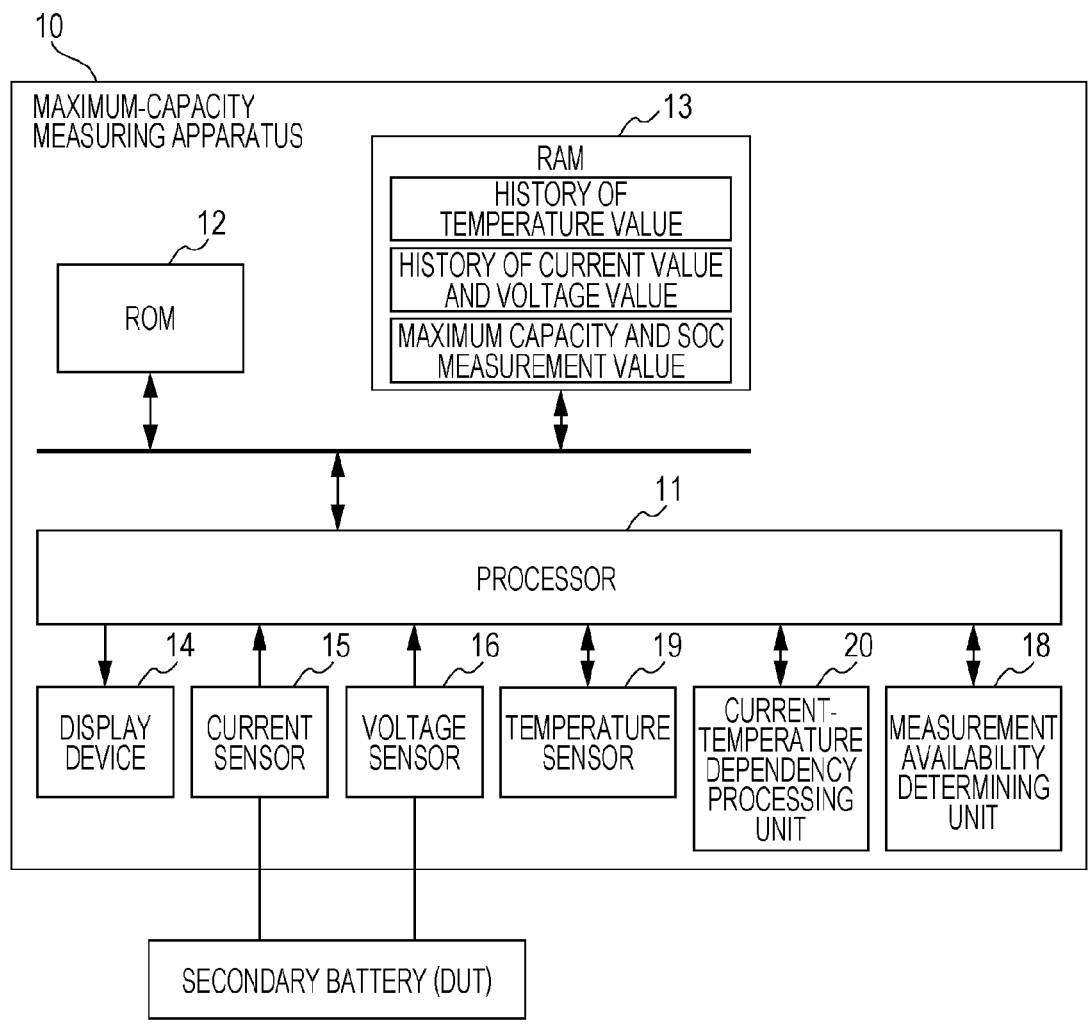
FIG. 13 is a block diagram illustrating another embodiment of this disclosure.

FIG. 13 is a block diagram illustrating the maximum-capacity measuring apparatus 10 according to another embodiment of this disclosure. In FIG. 13, the same reference numerals are given to the common parts in FIG. 1. The maximum-capacity measuring apparatus 10 in FIG. 13 includes a current-temperature dependency processing unit 20 instead of the current dependency processing unit 17 in the maximum-capacity measuring apparatus 10 of FIG. 1. A temperature sensor 19 illustrated in FIG. 13 detects the temperature of the DUT and converts the detected temperature into digital data. The temperature data measured by the temperature sensor 19 can be read from the processor 11.

Figure 14:
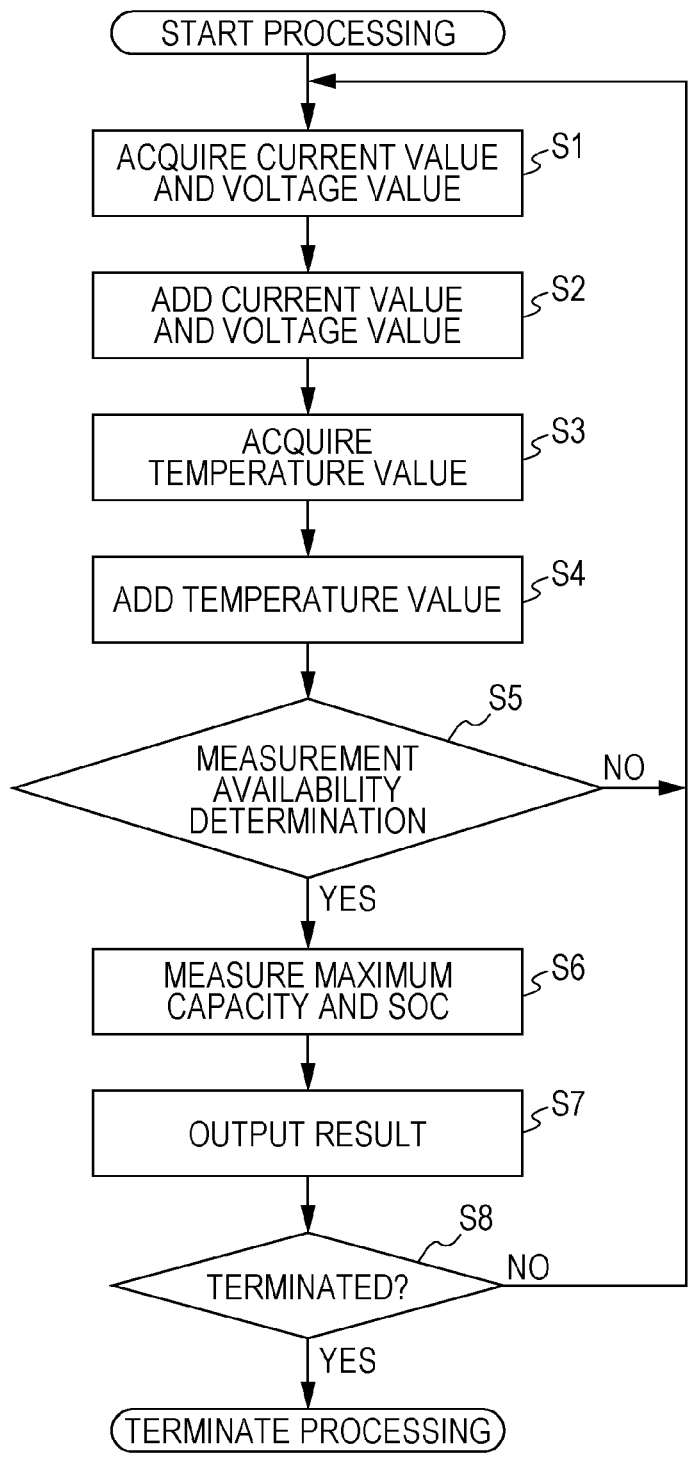
FIG. 14 is a flowchart describing a flow of operation of the maximum-capacity measuring apparatus illustrated in FIG. 13.

FIG. 14 is a flowchart describing a flow of operation of the maximum-capacity measuring apparatus 10 according to this embodiment. As illustrated in FIG. 14, first, the processor 11 acquires the current value and the voltage value (in step S1). That is, the processor 11 acquires the current value Imon through the current sensor 15 and acquires the voltage value Vmon through the voltage sensor 16. Additionally, the processor 11 acquires, simultaneously with these measurement values, the time data tmon through the clock function unit disposed inside or outside of the processor 11.

The processor 11 sequentially stores the acquired current value Imon and voltage value Vmon in the RAM 13 in the order corresponding to the history of the time data tmon (in step S3).

The processor 11 further acquires a temperature value Tmon through the temperature sensor 19 (in step S4). The processor 11 sequentially stores the acquired temperature value Tmon in the RAM 13 in the order corresponding to the history of the time data tmon (in step S4). The record data of the temperature sequentially stored in the RAM 13 is a data column that includes the measurement time data ti and the temperature value Ti (i=1 to N). In the record data of the temperature, the history of the temperature value Ti is also recorded as a ring buffer. When the data length exceeds the buffer length, the oldest data is deleted.

The RAM 13 sequentially stores various data such as the history data of the current value Ii, the voltage value Vi, and the temperature value Ti or the SOC measurement value representing the last measured maximum capacity or state of charge. The processor 11 determines whether the measurement of the maximum capacity of the DUT is possible through the measurement availability determining unit 18 based on these various data (in step S5). The processor 11 also sequentially stores this measurement availability determination in the RAM 13.

In the case where the measurement availability determining unit 18 determines that the measurement of the maximum capacity is possible, the processor 11 measures the maximum capacity and the SOC of the DUT through the current-temperature dependency processing unit 20 (in step S6). The processor 11 transfers the stored and memorized history data of the current value, the voltage value, and the temperature value in the RAM 13 to the current-temperature dependency processing unit 20. Subsequently, the processor 11 outputs the measurement start command to the current-temperature dependency processing unit 20. When the measurement processing for the maximum capacity and the SOC of the DUT based on the measurement start command terminates, the current-temperature dependency processing unit 20 outputs the measurement termination signal to the processor 11. When the processor 11 has confirmed the measurement termination signal, the processor 11 acquires the maximum capacity measurement value and the SOC measurement value from the current-temperature dependency processing unit 20. Subsequently, the processor 11 sequentially stores the acquired maximum capacity measurement value and SOC measurement value in the RAM 13.

In the case where the measurement availability determining unit 18 determines that the measurement of the maximum capacity is impossible, the processor 11 returns to step S1 and continues acquisition of the current value and the voltage value.

The processor 11 controls the display unit 14 to display the maximum capacity value and SOC value of the DUT stored in the RAM 13 and display the availability determination result of the measurement (in step S7).

The processor 11 repeatedly executes this sequence of the operations until the processing termination is determined (in step S8).

Figure 15:
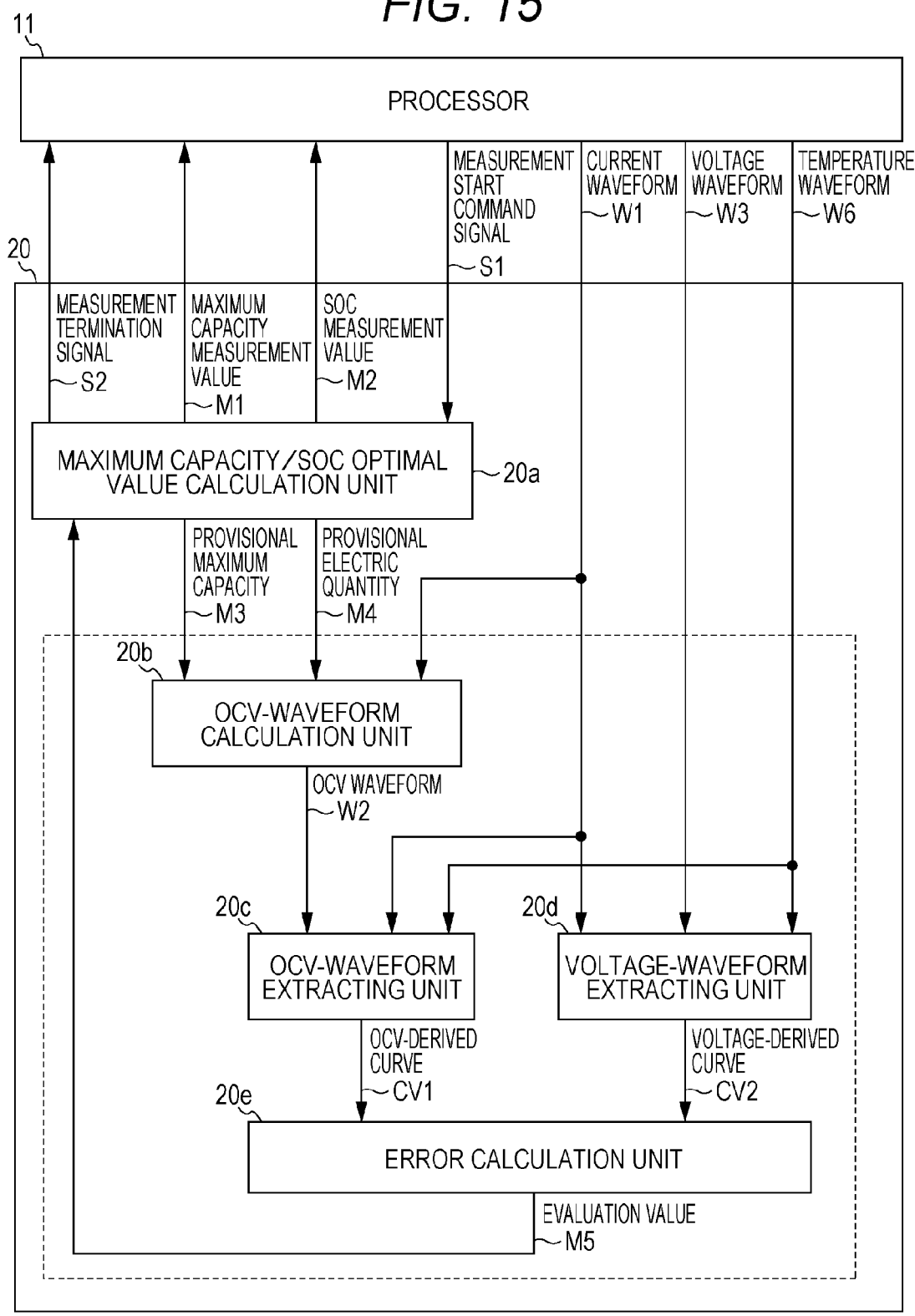
FIG. 15 is a block diagram illustrating a concrete example of the current-temperature dependency processing unit of FIG. 13.
Figure 16:
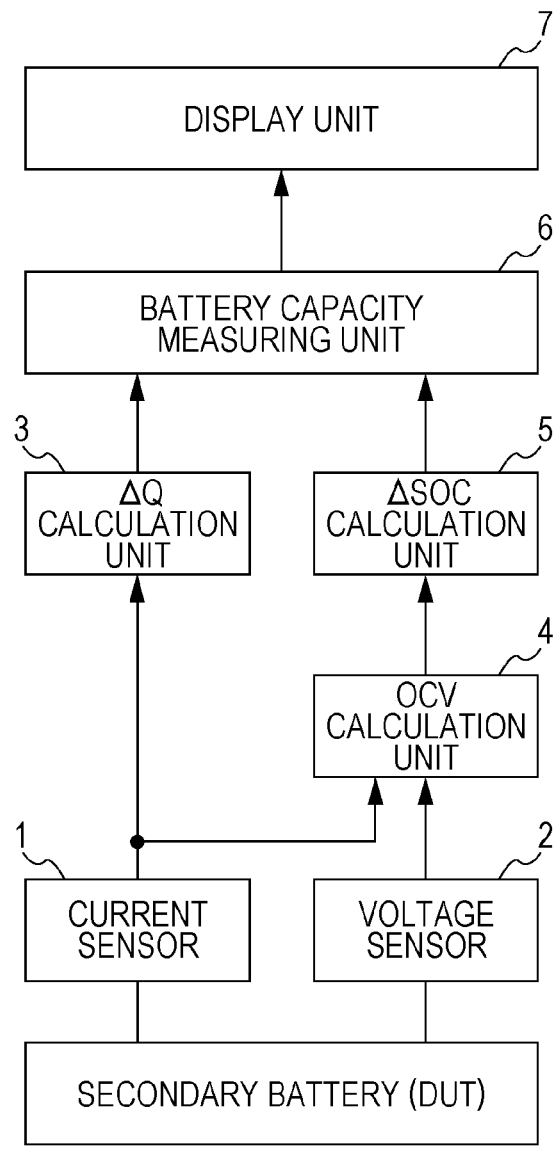
FIG. 16 is a block diagram illustrating one example of a conventional secondary-battery maximum-capacity measuring apparatus.

FIG. 15 is a block diagram illustrating a concrete example of the current-temperature dependency processing unit 20. In FIG. 15, the current-temperature dependency processing unit 20 includes a maximum capacity/SOC optimal value calculation unit 20a, an OCV-waveform calculation unit 20b, an OCV-waveform extracting unit 20c, a voltage-waveform extracting unit 20d, and an error calculation unit 20e.

The maximum capacity/SOC optimal value calculation unit 20a starts the measurement operation based on the measurement start command signal S1 output from the processor 11. The maximum capacity/SOC optimal value calculation unit 20a determines the maximum capacity measurement value M1 and the SOC measurement value M2. The maximum capacity measurement value M1 represents a measurement value of the present maximum capacity of the DUT coupled to the apparatus. The SOC measurement value M2 represents a measurement value of the SOC at the latest time tN in the history X of the current value and the voltage value that are stored at present.

For the determination of the maximum capacity measurement value M1 and the SOC measurement value M2, the maximum capacity/SOC optimal value calculation unit 20a repeats the following procedure. This procedure is repeated until a pair of the provisional maximum capacity M3 and the provisional electric quantity M4 is obtained in a state where an evaluation value output from the error calculation unit 20e becomes minimum.

1) The maximum capacity/SOC optimal value calculation unit 20a determines the provisional maximum capacity M3 and the provisional electric quantity M4.

2) The maximum capacity/SOC optimal value calculation unit 20a outputs the pair of the provisional maximum capacity M3 and the provisional electric quantity M4 to the OCV-waveform calculation unit 20b.

3) The OCV-waveform calculation unit 20b computes the OCV waveform W2 based on the pair of the provisional maximum capacity M3 and the provisional electric quantity M4 and the current waveform W1 input from the processor 11. Subsequently, the OCV-waveform calculation unit 20b outputs the computation result of the OCV waveform W2 to the OCV-waveform extracting unit 20c.

The OCV-waveform calculation unit 20b obtains the OCV waveform W2 as an open cell voltage that changes with time. The OCV waveform W2 includes, as illustrated in the above-described FIG. 5B, the time ti and the OCVi (i=1 to N) that is an open cell voltage OCV of the DUT at the time ti.

4) The OCV-waveform extracting unit 20c extracts the OCV-derived curve CV1 based on the OCV waveform W2 input from the OCV-waveform calculation unit 20b and the current waveform W1 and a temperature waveform W6 that are input from the processor 11. Subsequently, the OCV-waveform extracting unit 20c outputs the extracted OCV-derived curve CV1 to the error calculation unit 20e.

The OCV-derived curve CV1 includes a column of the value Yk (k=1 to M). When the gradient of the voltage Vi with respect to the time is determined to substantially coincide with the gradient of the open cell voltage OCV at the same time ti with respect to the time, the OCV-waveform extracting unit 20c extracts the OCVi. Subsequently, the OCV-waveform extracting unit 20c adds the extracted OCVi to the OCV-derived curve CV1.

The above-described determination is made corresponding to the current waveform W1 and the temperature waveform W6. The OCV-waveform extracting unit 20c extracts the temperature Ti and the open cell voltage OCVi from the OCV waveform W2 in accordance with the time change where i=1 to N. When it is determined that the current has changed by a certain amount or more or that the temperature has changed by a certain amount or more, the OCV-waveform extracting unit 20c then stops the extraction in the transient response time.

The transient response time is determined in proportion to a changed current $\Delta I$ or temperature $\Delta T$. The transient response time exists corresponding to the number of determinations where the current and/or the temperature have changed. The OCV-waveform extracting unit 20c subtracts the open cell voltage OCV at the starting point for each time period when the open cell voltage OCV is continuously extracted, from the open cell voltage OCV in the overall time period so as to determine the relative voltage Yk.

$$Yk=OCVi-OCV0(*\text{when } tk=ti)$$

OCV0: the open cell voltage OCV at the starting point for each time period when the open cell voltage OCV is continuously extracted 5) The voltage-waveform extracting unit 20d extracts the voltage-derived curve CV2 based on the current waveform W1, the voltage waveform W3, and the temperature waveform W6, which are input from the processor 11. Subsequently, the voltage-waveform extracting unit 20d outputs the extracted voltage-derived curve CV2 to the error calculation unit 20e. The voltage-derived curve CV2 includes the value Zk (k=1 to M).

When the gradient of the voltage Vi with respect to the time is determined to substantially coincide with the gradient of the open cell voltage OCV at the same time ti with respect to the time, the voltage-waveform extracting unit 20d extracts the voltage Vi. Subsequently, the voltage-waveform extracting unit 20d adds the extracted voltage Vi to the voltage-derived curve CV2.

The above-described determination is made corresponding to the voltage waveform W3 and the temperature waveform W6. The voltage-waveform extracting unit 20d extracts the temperature Ti and the voltage Vi from the voltage waveform W3 in accordance with the time change where i=1 to N. When it is determined that the current has changed by a certain amount or more or that the temperature has changed by a certain amount or more, the voltage-waveform extracting unit 20d stops the extraction in the transient response time.

The transient response time is determined in proportion to the changed current $\Delta I$ or temperature $\Delta T$. The transient response time exists corresponding to the number of determinations where the current has changed. The voltage-waveform extracting unit 20d subtracts the voltage at the starting point for each time period when the voltage is continuously extracted, from the voltage in the overall time period so as to determine the Zk.

$$Zk=Vi-V0(*\text{when } tk=ti)$$

V0: the voltage at the starting point for each time period when the voltage is continuously extracted 6) The error calculation unit 20e computes the evaluation value M5 of the error based on the OCV-derived curve CV1 input from the OCV-waveform extracting unit 20c and the voltage-derived curve CV2 input from the voltage-waveform extracting unit 20d. Subsequently, the error calculation unit 20e inputs the computation result of the evaluation value M5 to the maximum capacity/SOC optimal value calculation unit 20a.

7) The maximum capacity/SOC optimal value calculation unit 20a outputs the pair of the provisional maximum capacity M3 and the provisional electric quantity M4 in a state where the evaluation value M5 becomes minimum to the processor 11 as the maximum capacity measurement value M1 and the SOC measurement value M2. Here, the SOC measurement value M2 is a value obtained by dividing the provisional electric quantity M4 by the provisional maximum capacity M3. This function is typical curve fitting using the maximum capacity and the electric quantity as coefficients, and can employ various algorithms.

8) The maximum capacity/SOC optimal value calculation unit 20a outputs the measurement termination signal S2 to the processor 11 when the sequence of the measurement processing is completed.

As described above, this disclosure can provide a secondary-battery maximum-capacity measuring apparatus that allows measurement of the maximum capacity of the secondary battery even in an environment where the secondary battery is used without having the output current of 0 A.

The OCV-waveform extracting unit 17c may be configured to extract the open cell voltage OCV and use this open cell voltage OCV to generate the first relative voltage Yk when the gradient of the inter-terminal voltage with respect to the time is determined to coincide with the gradient of the open cell voltage at the same time ti with respect to the time. Furthermore, the voltage-waveform extracting unit 17d may be configured to extract the inter-terminal voltage Vi and use this inter-terminal voltage Vi to generate the second relative voltage Zk when the gradient of the inter-terminal voltage with respect to the time is determined to coincide with the gradient of the open cell voltage at the same time ti with respect to the time.

For the determination of the maximum capacity measurement value M1 and the SOC measurement value M2, the maximum capacity/SOC optimal value calculation unit 17a may repeat the following procedure. This procedure may be repeated until a combination of the pair of the provisional maximum capacity M3 and the provisional electric quantity M4 is obtained in a state where the evaluation value output from the error calculation unit 17e becomes minimum. (1) The maximum capacity/SOC optimal value calculation unit 17a determines the provisional maximum capacity M3 and the provisional electric quantity M4. (2) The maximum capacity/SOC optimal value calculation unit 17a outputs the combination of the pair of the provisional maximum capacity M3 and the provisional electric quantity M4 to the OCV-waveform calculation unit 17b. (3) The OCV-waveform calculation unit 17b computes the OCV waveform W2 based on the combination of the pair of the provisional maximum capacity M3 and the provisional electric quantity M4 and the input current waveform W1 of the secondary battery from the processor 11. Subsequently, the OCV-waveform calculation unit 17b outputs the computation result of the OCV waveform W2 to the OCV-waveform extracting unit 17c. (4) The OCV-waveform extracting unit 17c extracts (creates) the OCV-derived curve (the open cell voltage-derived curve) CV1 based on the OCV waveform W2 input from the OCV-waveform calculation unit 17b and the current waveform W1 input from the processor 11. Subsequently, the OCV-waveform extracting unit 17c outputs the extracted OCV-derived curve CV1 to the error calculation unit 17e. (5) The voltage-waveform extracting unit (the inter-terminal voltage-waveform extracting unit) 17d extracts (creates) the voltage-derived curve (the inter-terminal voltage-derived curve) CV2 based on the current waveform W1 and the voltage waveform W3, which are input from the processor 11. The voltage-waveform extracting unit 17d outputs the extracted voltage-derived curve CV2 to the error calculation unit 17e. (6) The error calculation unit 17e computes the evaluation value M5 of the error based on the OCV-derived curve CV1 input from the OCV-waveform extracting unit 17c and the voltage-derived curve CV2 input from the voltage-waveform extracting unit 17d. The error calculation unit 17e inputs the computation result of the evaluation value M5 to the maximum capacity/ SOC optimal value calculation unit 17a. (7) The maximum capacity/SOC optimal value calculation unit 17a outputs the combination of the pair of the provisional maximum capacity M3 and the provisional electric quantity M4 in a state where the evaluation value M5 becomes minimum to the processor 11 as the maximum capacity measurement value M1 and the SOC measurement value M2.

The voltage-waveform extracting unit 17d may be configured to extract the voltage Vi and add the extracted voltage Vi to the voltage-derived curve when the gradient of the voltage Vi with respect to the time is determined to substantially coincide with the gradient of the open cell voltage OCV at the same time ti with respect to the time. Furthermore, the OCV-waveform extracting unit 17c may be configured to extract the OCVi and add the extracted OCVi to the OCV-derived curve CV1 when the gradient of the voltage Vi with respect to time is determined to substantially coincide with the gradient of the open cell voltage OCV at the same time ti with respect to time.

The voltage-waveform extracting unit 20d may extract the voltage-derived curve CV2 from the voltage waveform W3 based on the current waveform W1, the voltage waveform W3, and the temperature waveform W6, which are input from the processor 11.

The secondary-battery maximum-capacity measuring apparatus of this disclosure may be first to fifth secondary-battery maximum-capacity measuring apparatuses as follows.

The first secondary-battery maximum-capacity measuring apparatus is a secondary-battery maximum-capacity measuring apparatus for measuring a maximum capacity of a secondary battery in use. Current dependency processor is disposed to convert an inter-terminal voltage and an open cell voltage of the secondary battery into values without depending on a load current based on an amount of change in relative value of a voltage during a time period when a constant current regardless of time change is extracted from the secondary battery. Error calculator is disposed to compute errors of the converted inter-terminal voltage and open cell voltage of the secondary battery by this current dependency processor.

The second secondary-battery maximum-capacity measuring apparatus according to the first secondary-battery maximum-capacity measuring apparatus measures a difference between a voltage at a starting point and a voltage at an ending point during the time period when the constant current regardless of time change is extracted from the secondary battery, as the amount of change in relative value of the voltage.

The third secondary-battery maximum-capacity measuring apparatus according to the first secondary-battery maximum-capacity measuring apparatus differentiates a voltage during the time period when the constant current regardless of time change is extracted from the secondary battery, as the amount of change in relative value of the voltage.

In the fourth secondary-battery maximum-capacity measuring apparatus according to any one of the first to third secondary-battery maximum-capacity measuring apparatuses, the current dependency processor retrieves and processes measurement data of environmental elements including a temperature.

The fifth secondary-battery maximum-capacity measuring apparatus according to any one of the first to fourth secondary-battery maximum-capacity measuring apparatuses includes measurement availability determiner configured to determine availability of maximum capacity measurement of the secondary battery based on distribution of state of charge in a predicted value waveform of a state of charge and distribution of feature points of state of charge versus open cell voltage characteristics.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A secondary-battery maximum-capacity measuring apparatus, comprising:
 a current dependency processing unit configured to convert an inter-terminal voltage and an open cell voltage of a secondary battery into values without depending on a load current based on an amount of change in relative value of a voltage during a time period when a constant current is drawn from the secondary battery; and
 an error calculation unit configured to compute errors of the inter-terminal voltage and the open cell voltage of the secondary battery, the inter-terminal voltage and the open cell voltage being converted by the current dependency processing unit.

2. The secondary-battery maximum-capacity measuring apparatus according to claim 1, wherein
 the current dependency processing unit is configured to measure a difference between a voltage at a starting point and a voltage at an ending point during the time period when the constant current is drawn from the secondary battery, so as to calculate the amount of change in relative value of the voltage.

3. The secondary-battery maximum-capacity measuring apparatus according to claim 1, wherein
 the current dependency processing unit is configured to differentiate a voltage during the time period when the constant current is drawn from the secondary battery, so as to calculate the amount of change in relative value of the voltage.

4. The secondary-battery maximum-capacity measuring apparatus according to claim 1, wherein
 the current dependency processing unit is configured to retrieve and process measurement data of an environmental element including a temperature.

5. The secondary-battery maximum-capacity measuring apparatus according to claim 1, further comprising
 a measurement availability determining unit configured to determine availability of maximum capacity measurement of the secondary battery based on distribution of state of charge in a predicted value waveform of a state of charge and distribution of feature points of state of charge versus open cell voltage characteristics.

6. A secondary-battery maximum-capacity measuring apparatus, comprising:
 an open cell voltage-waveform calculation unit configured to receive a plurality of pairs of provisional maximum capacity and provisional electric quantity in a secondary battery, and to compute an open cell voltage waveform for each pair based on each pair and a current waveform of the secondary battery;
 an open cell voltage-waveform extracting unit configured to extract an open cell voltage-derived curve based on the open cell voltage waveform and the current waveform;
 an inter-terminal voltage-waveform extracting unit configured to extract an inter-terminal voltage-derived curve based on the current waveform and a waveform of an inter-terminal voltage of the secondary battery;
 an error calculation unit configured to obtain a degree of coincidence between the open cell voltage-derived curve and the inter-terminal voltage-derived curve as an evaluation value; and
 an optimal value calculation unit configured to output a provisional maximum capacity in a pair of the provisional maximum capacity and the provisional electric quantity in a state where the evaluation value becomes minimum, as a maximum capacity measurement value of the secondary battery.

7. The secondary-battery maximum-capacity measuring apparatus according to claim 6, wherein
 the open cell voltage-waveform extracting unit is configured to determine a first relative voltage by subtracting an open cell voltage at a starting point for each time period when an open cell voltage is continuously extracted, from an open cell voltage in an overall time period, so as to include the first relative voltage in the open cell voltage-derived curve,
 the inter-terminal voltage-waveform extracting unit is configured to determine a second relative voltage by subtracting an inter-terminal voltage at a starting point for each time period when an inter-terminal voltage is continuously extracted, from an inter-terminal voltage in an overall time period, so as to include the second relative voltage in the inter-terminal voltage-derived curve, and
 the error calculation unit is configured to calculate the evaluation value based on the first relative voltage and the second relative voltage.

8. The secondary-battery maximum-capacity measuring apparatus according to claim 7, wherein
 the error calculation unit is configured to calculate the evaluation value based on a square of difference between the first relative voltage and the second relative voltage.

9. The secondary-battery maximum-capacity measuring apparatus according to claim 7, wherein
 the open cell voltage-waveform extracting unit is configured to extract an open cell voltage and use this open cell voltage to generate the first relative voltage when a gradient of the inter-terminal voltage with respect to time is determined to coincide with a gradient of the open cell voltage at a same time with respect to time, and
 the inter-terminal voltage-waveform extracting unit is configured to extract an inter-terminal voltage and use this inter-terminal voltage to generate the second relative voltage when a gradient of the inter-terminal voltage with respect to time is determined to coincide with a gradient of the open cell voltage at a same time with respect to time.

* * * * *